(12) United States Patent
Motz et al.

(10) Patent No.: US 11,662,756 B2
(45) Date of Patent: *May 30, 2023

(54) ELECTRIC DEVICES, INTEGRATED CIRCUITS, AND METHODS FOR MONITORING VOLTAGES

(71) Applicant: Infineon Technologies AG, Neubiberg (DE)

(72) Inventors: Mario Motz, Wernberg (AT); Umberto Aracri, Villach (AT); Alessandro Michelutti, Villach (AT)

(73) Assignee: Infineon Technologies AG, Neubiberg (DE)

( * ) Notice: Subject to any disclaimer, the term of this patent is extended or adjusted under 35 U.S.C. 154(b) by 83 days.

This patent is subject to a terminal disclaimer.

(21) Appl. No.: 17/246,817

(22) Filed: May 3, 2021

(65) Prior Publication Data

US 2021/0255651 A1    Aug. 19, 2021

Related U.S. Application Data

(63) Continuation of application No. 15/876,315, filed on Jan. 22, 2018, now Pat. No. 11,022,991.

(30) Foreign Application Priority Data

Feb. 8, 2017   (DE) ...................... 10 2017 102 499.9

(51) Int. Cl.
*G05F 1/571*    (2006.01)
*G01K 7/01*    (2006.01)
(Continued)

(52) U.S. Cl.
CPC ............... *G05F 1/571* (2013.01); *G01K 7/01* (2013.01); *G01R 19/1659* (2013.01); *G01R 19/16538* (2013.01); *G05F 3/30* (2013.01)

(58) Field of Classification Search
CPC ............... G01K 7/01; G01R 19/16538; G01R 19/1659; G05F 1/571; G05F 3/30
See application file for complete search history.

(56) References Cited

U.S. PATENT DOCUMENTS

| | | | | |
|---|---|---|---|---|
| 5,291,122 A | * | 3/1994 | Audy | ........................ G05F 3/30 323/907 |
| 11,022,991 B2 | * | 6/2021 | Motz | .................. G01R 19/1659 |
| 2012/0038367 A1 | * | 2/2012 | Fefer | .................. G01R 31/2884 324/538 |

* cited by examiner

*Primary Examiner* — Son T Le
*Assistant Examiner* — Adam S Clarke
(74) *Attorney, Agent, or Firm* — Harrity & Harrity, LLP

(57) ABSTRACT

An integrated circuit includes a first bandgap voltage reference sub-circuit configured to provide a first bandgap reference voltage; a second bandgap voltage reference sub-circuit configured to provide a second bandgap reference voltage; a voltage regulator sub-circuit configured to derive a first supply voltage using the first bandgap reference voltage and a second supply voltage using the second bandgap reference voltage; a bandgap comparator sub-circuit configured to derive a first internal voltage and a second internal voltage from the first supply voltage, wherein the first internal voltage decreases at a higher rate than the second internal voltage with respect to a decreasing first supply voltage, wherein the bandgap comparator sub-circuit is configured indicate which of the first and the second internal voltages is larger; and a comparator sub-circuit configured to indicate whether a difference between the first supply voltage and the second supply voltage is larger than a predefined threshold.

19 Claims, 9 Drawing Sheets

(51) Int. Cl.
*G01R 19/165* (2006.01)
*G05F 3/30* (2006.01)

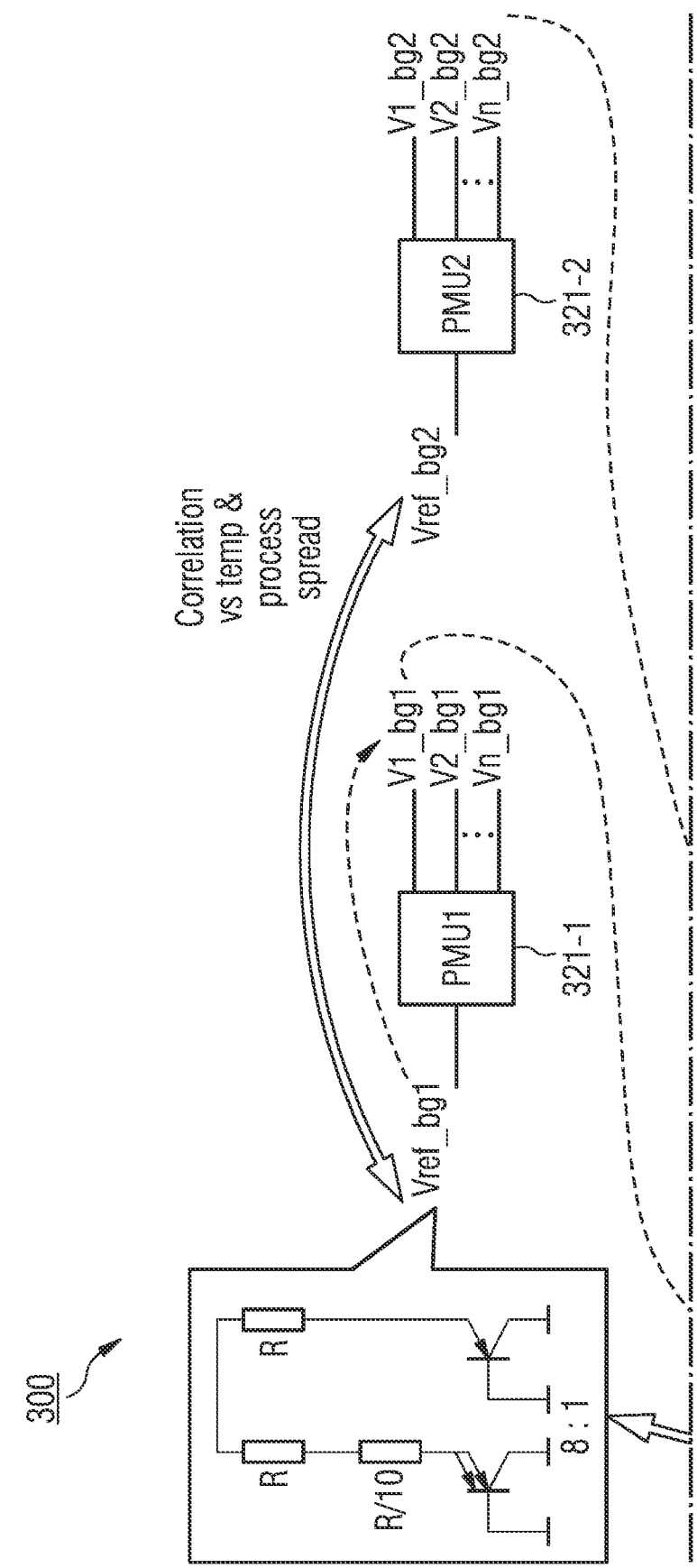

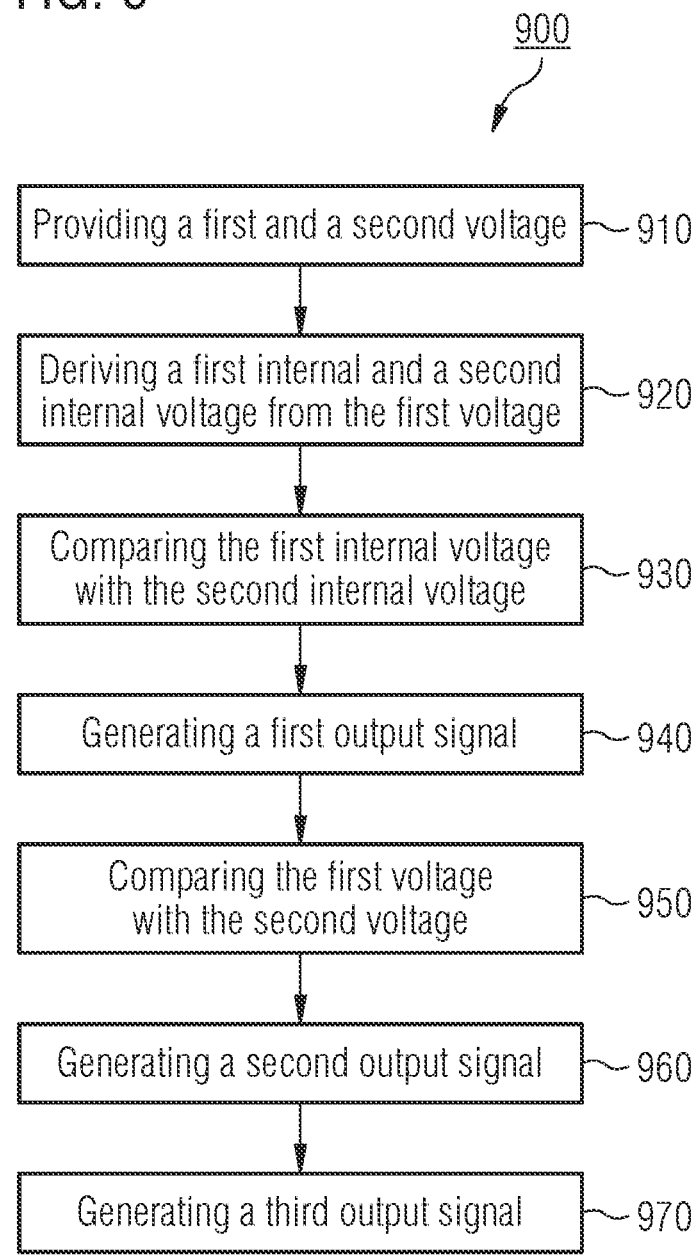

ELECTRIC DEVICES, INTEGRATED CIRCUITS, AND METHODS FOR MONITORING VOLTAGES

CROSS-REFERENCE TO RELATED APPLICATIONS

This application is a continuation of U.S. patent application Ser. No. 15/876,315 filed Jan. 22, 2018, which claims the benefit of German Patent Application No. 10 2017 102 499.9 filed Feb. 8, 2017, which are incorporated by reference as if fully set forth.

FIELD

This disclosure relates to electric devices, integrated circuits, and methods for monitoring voltages.

BACKGROUND

To set electric devices and integrated circuits into operation, they are supplied with electric power, voltages, and currents. Often more than one voltage is present within an electric device or an integrated circuit. For example, an electric device often comprises power supply circuits, voltage converters, voltage regulators and the like to provide voltages at different levels for operating the electric device. As long as these voltages remain within certain tolerance intervals, the electric device can operate reliably. However, under too high deviation of the voltages, the electric device is prone to erroneous operation. It is therefore desired to monitor and to measure these voltages. Nonetheless, voltage measurements are subjected to measurement uncertainties due to which a monitored voltage may be thought of as being outside its tolerance interval even though it is not. This can result in a false alarm when surveilling the voltage. On the other hand, measurement uncertainties can make a monitored voltage look like as being within its tolerance interval while it is actually not. This can result in the failure of the voltage remaining unrecognized.

Hence, there is a demand for new concepts for monitoring voltages at an improved accuracy. Such a demand may at least partially be satisfied by the subject matter of the present disclosure.

SUMMARY

An electric device comprises a power supply circuit. The power supply circuit is configured to provide a first voltage and at least a second voltage. Furthermore, the electric device comprises a first verification circuit. The first verification circuit comprises an input terminal for the first voltage. The first verification circuit is configured to derive a first and a second internal voltage from the first voltage, to compare the first internal voltage with the second internal voltage, and to generate a first output signal based on the comparison of the first internal voltage with the second internal voltage. Furthermore, the electric device comprises a second verification circuit comprising a first input terminal for the first voltage and a second input terminal for the second voltage. The second verification circuit is configured to compare the first voltage with the second voltage and to generate a second output signal based on the comparison of the first voltage with the second voltage. Furthermore, the electric device 200 comprises a combination circuit configured to generate a third output signal if at least one of the first output signal and the second output signal is indicative for at least one of the first voltage and the second voltage being outside a predefined tolerance range.

An integrated circuit comprises a first bandgap voltage reference sub-circuit. The first bandgap voltage reference sub-circuit is configured to provide a first bandgap reference voltage. Furthermore, the integrated circuit comprises a second bandgap voltage reference sub-circuit configured to provide a second bandgap reference voltage. Furthermore, the integrated circuit comprises a voltage regulator sub-circuit configured to derive a first supply voltage using the first bandgap reference voltage and a second supply voltage using the second bandgap reference voltage. Furthermore, the integrated circuit comprises a bandgap comparator sub-circuit configured to derive a first internal voltage and a second internal voltage from the first supply voltage. The first internal voltage decreases at a higher rate than the second internal voltage with respect to a decreasing first supply voltage. The bandgap comparator sub-circuit is configured to compare the first internal voltage with the second internal voltage and to indicate which of the first internal voltage and the second internal voltage is larger than the other by a first output signal. Furthermore, the integrated circuit comprises a comparator sub-circuit configured to compare the first supply voltage with the second supply voltage and to indicate a deviation between the first and the second supply voltage larger than a predefined threshold by a second output signal.

A method for monitoring voltages comprises providing a first and a second voltage. Furthermore, the method comprises deriving a first internal voltage and a second internal voltage from the first voltage. The first internal voltage decreases at a higher rate than the second internal voltage with respect to a decreasing first voltage. Furthermore, the method comprises comparing the first internal voltage with the second internal voltage. Furthermore, the method comprises generating a first output signal based on the comparison of the first internal voltage with the second internal voltage. Furthermore, the method comprises comparing the first voltage with the second voltage. Furthermore, the method comprises generating a second output signal based on the comparison of the first voltage with the second voltage. Furthermore, the method comprises generating a third output signal if at least one of the first and the second output signal is indicative for at least one of the first and the second voltage being outside a predefined tolerance range.

BRIEF DESCRIPTION OF THE DRAWINGS

Some examples of apparatuses and/or methods will be described in the following by way of example only, and with reference to the accompanying figures, in which

FIGS. 3A-3C show a circuit schematic of an electric device over three parts;

FIG. 9 shows a flow chart of a method for monitoring voltages.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
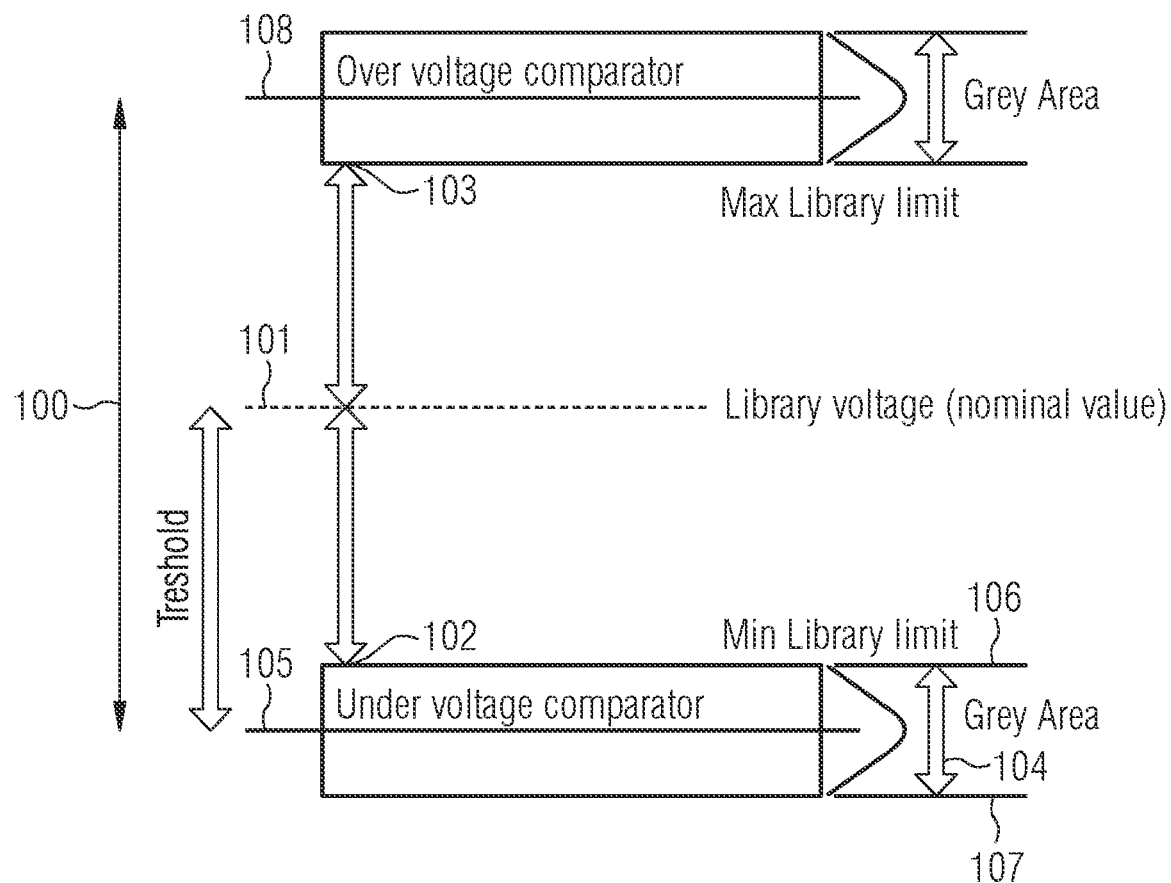
FIG. 1 shows a graphic illustration of a tolerance range of a monitored voltage.

FIG. 1 shows a graphic illustration of a tolerance range 100 of a monitored voltage. A library value 101 (or nominal value or target value) of the monitored voltage is placed in the middle of the tolerance range 100. The monitored voltage is allowed to vary within a minimum library limit 102 and a maximum library limit 103. To detect whether the monitored voltage falls below the minimum library limit 102 an undervoltage comparator is used, whose switching threshold varies within an uncertainty interval 104. In order to avoid the undervoltage comparator from being triggered while the monitored voltage is still larger than the minimum library limit 102, the nominal threshold 105 of the undervoltage comparator is set such that the highest possible threshold 106 of the undervoltage comparator coincides with the minimum library limit 102. This can avoid false alarms, because only if the monitored voltage falls at least below its minimum library limit 102, the undervoltage comparator may trigger. However, this can also result in the falling of the monitored voltage below the minimum library limit 102 remaining undetected if the actual switching threshold of the undervoltage comparator does not coincide with the minimum library limit 102. That is to say, there is a voltage interval (also referred to as grey area) in which the monitored voltage might not be detected as being too low.

This grey area could be avoided, if the nominal threshold 105 of the undervoltage comparator was set such that the lowest possible threshold level 107 of the undervoltage comparator would coincide with the minimum library limit 102. On the other hand, this could trigger false alarms, because the undervoltage comparator may trigger even though the monitored voltage is still larger than the minimum library limit 102. Such false alarms could reduce the functional availability of a system.

In other words, a grey area can be the difference between the worst case of a reset threshold comparator and the minimum voltage of the library allowed for the used technology. An alternative solution, in order to avoid grey area, can be moving the reset threshold inside the library voltage range. Such an approach will however reduce system availability as a tradeoff.

A similar question exists where to set the nominal threshold of an overvoltage comparator in order to detect whether the monitored voltage exceeds the maximum library limit. No matter where the thresholds of the under- and overvoltage comparators may be placed, there may still be a tradeoff between high detection probability and low rate of false alarms. According to the present disclosure, concepts for electric devices, integrated circuits and methods for monitoring voltages are proposed, which can (at least) partially resolve this tradeoff and can thus provide a higher operational reliability and/or operational availability of electric circuits and/or electric systems. Examples of the present disclosure may also enhance other reliability and/or availability aspects of electric devices and/or integrated circuits.

Figure 2:
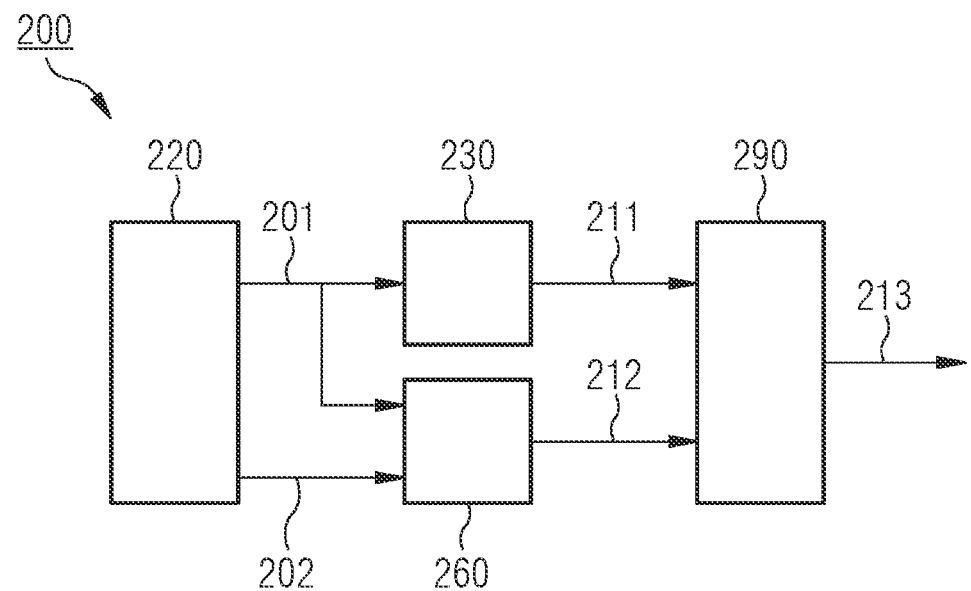
FIG. 2 shows a block diagram of an electric device with a power supply circuit, a first and second verification circuit, and a combination circuit.

FIG. 2 shows a block diagram of an electric device 200. The electric device 200 comprises a power supply circuit 220. The power supply circuit 220 is configured to provide a first voltage 201 and at least a second voltage 202. Furthermore, the electric device 200 comprises a first verification circuit 230. The first verification circuit 230 comprises an input terminal for the first voltage 201. The first verification circuit 230 is configured to derive a first internal voltage and a second internal voltage from the first voltage 201. The first verification circuit 230 is further configured to compare the first internal voltage with the second internal voltage, and further configured to generate a first output signal 211 based on the comparison of the first internal voltage with the second internal voltage. Furthermore, the electric device 200 comprises a second verification circuit 260 comprising a first input terminal for the first voltage 201 and a second input terminal for the second voltage 202. The second verification circuit 260 is configured to compare the first voltage 201 with the second voltage 202 and to generate a second output signal 212 based on the comparison of the first voltage 201 with the second voltage 202. Furthermore, the electric device 200 comprises a combination circuit 290 configured to generate a third output signal 213 if at least one of the first output signal 211 and the second output signal 212 is indicative for at least one of the first voltage 201 and the second voltage 202 being outside a predefined tolerance range.

By providing the electric device 200 with the first and the second verification circuit 230, 260 and connecting their respective input terminals to the first and the second voltage 201, 202 (e.g., supply voltages) of the power supply circuit 220 in the described manner, the first and the second voltage 201, 202 can be monitored. The first and/or the second verification circuit 230, 260 can indicate a too high deviation of the first and/or the second voltage by the first and/or the second output signal 211, 212 to the combination circuit 290, which can in turn generate the third output signal 213 depending on the first and/or the second output signal 211, 212. This can enhance the operational reliability of the electric device 200.

The first verification circuit 230 can derive the first and the second internal voltage from the first voltage 201 and compare the first with the second internal voltage. This can allow the first verification circuit 230 to perform an absolute check of the first voltage 201. In this absolute check, the level of the first voltage 201 relative to ground potential of the electric device 200 can be verified. The second verification circuit 260 is configured to compare the first voltage 201 with the second voltage 202 and can thus perform a relative check (or cross check) between the first and the second voltage 201, 202. This can relax the manufacturing tolerances and thus reduce manufacturing costs and/or size of the electric device 200. Performing an absolute check of a voltage (e.g., referenced to ground potential) may in itself require smaller manufacturing tolerances for the first verification circuit 230 for reaching an acceptable inaccuracy of the absolute check. On the other hand, the relative check between the first and the second voltage may in itself allow larger manufacturing tolerances of the second verification circuit 260 for reaching an acceptable inaccuracy of the relative check or a relative check may be easier to implement than an absolute check so that lower manufacturing tolerances of the second verification circuit 260 can be reached with less effort.

Hence, the absolute check of the first verification circuit 230 may be performed at a higher inaccuracy than the relative check of the second verification circuit 260. With an uncertainty corresponding to the inaccuracy of the first verification circuit 230, the absolute check of the first verification circuit 230 can then indicate via the first output signal 211 whether the absolute level of the first voltage 201 is within a predefined first tolerance range. In order to avoid a false alarm because of the higher inaccuracy of the absolute check of the first voltage 201, the first tolerance range of the first verification circuit 230 can be made wider. For example, the highest possible threshold of an undervoltage comparator of the first verification circuit 230 can be set to coincide with the minimum library limit of the first voltage 201 and/or the lowest possible threshold of an overvoltage comparator of the first verification circuit 230 can be set to coincide with the maximum library limit of the first voltage 201.

With a lower uncertainty corresponding to the lower inaccuracy of the second verification circuit 260, the relative check of the second verification circuit 260 can indicate via the second output signal 212 whether a deviation between the first voltage 201 and the second voltage 202 is smaller than a predefined second tolerance range. Assuming that in most cases there are only single errors present within the electric device 200 (e.g., either the first or the second voltage may be deviating too much from its respective target value), a pass of both the absolute check and the relative check can be indicative for both the first and the second voltage (referenced to ground potential) being within their respective tolerance range. This result can be given at the lower inaccuracy of the second verification circuit 260.

In other words, if it is verified by the absolute check of the first verification circuit 230 that the first voltage 201 (e.g., the absolute level of the first voltage 201) is within the predefined first tolerance range and if it is verified by the relative check of the second verification circuit 260 that a deviation between the first voltage 201 and the second voltage 202 is also smaller than the predefined second tolerance range, it can be deduced, that also the level of the second voltage 202 relative to ground potential (e.g., the absolute level of the second voltage) is within an allowed tolerance range of the second voltage 202. On the other hand, if the absolute check of the first verification circuit 230 is passed, but the relative check of the second verification circuit 260 indicates a too high deviation between the first voltage 201 and the second voltage 202, this can be indicative for at least one of the absolute level of the first and the second voltage showing a too high deviation from its respective target value. Again, this result can be given at the lower inaccuracy of the second verification circuit 260.

The first verification circuit 230 can be configured to derive the first and the second internal voltage from the first voltage 201 causing the first internal voltage to decrease at a higher rate with decreasing first voltage 201 than the second internal voltage may decrease with decreasing first voltage 201. That is to say, the first internal voltage can decrease at a higher rate than the second internal voltage with respect to a decreasing first voltage 201. For example, the first internal voltage can dependent substantially linearly on the first voltage 201, which may comprise the use of a resistor, for instance. On the other hand, the second internal voltage can dependent substantially logarithmically on the first voltage 201, which may comprise the use of a diode and/or a transistor. Letting the first internal voltage decrease at a higher rate than the second internal voltage with respect to a decreasing first voltage 201 can allow the first verification circuit 230 performing an absolute check of the first voltage 201.

For example, the first verification circuit 230 can be configured to generate the first output signal 211 based on whether the first voltage 201 falls below a predefined (first) threshold. At the predefined threshold, the first internal voltage can be equal to the second internal voltage. For instance, as long as the first voltage 201 is above the predefined threshold, the first internal voltage may be larger than the second internal voltage. Since the first internal voltage can decrease faster than the second internal voltage with respect to a decreasing first voltage 201, a decrease in the first voltage 201 may at first decrease the difference between the first and the second internal voltage until the first and the second internal voltage are equal. This level of the first voltage 201, where the first internal voltage and the second internal voltage are equal, can thus correspond to the predefined (first) threshold for the absolute check of the first voltage 201. For example, the first verification circuit 230 can comprise a comparator (and/or an operational amplifier, and/or a differential amplifier) to compare the first internal voltage with the second internal voltage. The more the first voltage 201 falls below the predefined (first) threshold, the larger the difference between the first internal voltage and the second internal voltage may become again, but this time the first internal voltage being smaller than the second internal voltage. The first output signal 211 can be an analog or a digital signal. For example, a high level of the output signal 211 can indicate that the first voltage 201 is above the predefined (first) threshold (alternatively, a low level of the output signal 211 can indicate that the first voltage 201 is above the predefined (first) threshold).

For example, the first verification circuit 230 comprises a bandgap comparator. The bandgap comparator can be configured to derive the first internal voltage and the second internal voltage from the first voltage 201 and to compare the first internal voltage with the second internal voltage. Both a sensing terminal and a power supply terminal of the bandgap comparator can be connected to the first voltage 201. In this way, the first verification circuit 230 can be autonomous since it can be supplied with the first voltage 201 which can also be the monitored voltage of the bandgap comparator. In other words, the operation of the bandgap comparator may be independent from supply voltages other than the first voltage 201. To this end, the bandgap comparator can be configured to generate the first output signal 211 based on the comparison of the first internal voltage with the second internal voltage. As long as the first internal voltage is larger than the second internal voltage, the sensed first voltage 201 may be above the predefined (first) threshold. This may be indicated by the first output signal 211 being at a high level. A decrease of the first voltage 201 below the predefined (first) threshold causing the first internal voltage decreasing below the second internal voltage, can be indicated by the first output signal 211 being at a low level.

A low level of the first output signal 211 indicating the first voltage as being too low can also be helpful, because when the supply voltage of the bandgap comparator fails (e.g., becomes too low), the first output signal 211 might not be able to rise to the high level and be at the low level instead. This can correspond to the desired behavior of the first verification circuit 230 indicating a too low first voltage 201 (that is the supply voltage of the bandgap comparator) by the first output signal 211 being at the low level.

The bandgap comparator can comprise a bandgap kernel. The bandgap kernel can comprise a first and a second bipolar transistor and a resistor. During operation of the electric device 200, the base of the first bipolar transistor can be at the same electric potential as the base of the second bipolar transistor. For example, the base of the first bipolar transistor can be connected to the base of the second bipolar transistor via a conductive connection (e.g., a short circuit) and/or via a virtual short circuit. The emitter of the first bipolar transistor can be connected to a first terminal of the resistor. During operation of the electric device 200, the first internal voltage can corresponds to (e.g., be equal to) an electric potential of a second terminal of the resistor. During operation of the electric device 200, the second internal voltage can correspond to (e.g., be equal to) an electric potential of the emitter of the second bipolar transistor. The first internal voltage can then drop at least across the resistor and the first bipolar transistor to ground, which can create a steeper slope for the first internal voltage as a function of the first voltage 201 than for the second internal voltage, which can drop at least across the second bipolar transistor to ground. Providing a larger emitter area for the first bipolar transistor (e.g., at least 1.5 larger, or 2 times larger, or 4 times larger, or 8 times larger, or 16 times larger) than for the second bipolar transistor can support that, when the first voltage 201 is at its target value, the first internal voltage may be larger than the second internal voltage and, when the first voltage 201 decreases below the predefined (first) threshold, the first internal voltage may decrease below the second internal voltage.

The second verification circuit 260 can comprise a power supply terminal connected to the first voltage 201. That is to say, the first voltage 201 can be a supply voltage of the second verification circuit 260. This can improve the operational reliability of the electric device 200, because a failure of the supply voltage (e.g., a too low supply voltage) of the second verification circuit 260, which can cause an unreliable operation of the second verification circuit 260, can be detected by the first verification circuit 230.

For example, the first verification circuit 230 can be configured to generate the first output signal 211 based on whether the first voltage falls below the predefined (first) threshold and the second verification circuit 260 may become inoperable if the first voltage falls below the predefined (first) threshold. In other words, the minimum supply voltage at which the second verification circuit 260 can be operated may correspond to (e.g., be equal to) the predefined (first) threshold. This way, the first output signal 211 can indicate whether the second verification circuit 260 is operable or not.

According to some examples, the first verification circuit 230 can be configured to generate the first output signal 211 based on whether the first voltage 201 falls below the predefined first threshold. The second verification circuit 260 can be configured to generate the second output signal based on whether the first voltage 201 deviates by more than a predefined second threshold from the second voltage 202. A difference between a target value of the first voltage 201 and the first threshold can be at least twice as large (or at least three times as large, or at least four times as larger, or at least eight times as large) as the second threshold. As explained already above, this can allow the first verification circuit 230 to perform an absolute check of the first voltage 201 at an inaccuracy that is higher than the inaccuracy of the second verification circuit 260 during performing the relative check between the first voltage 201 and the second voltage 202. In spite of the higher inaccuracy of the first verification circuit 230, false alarms of the first verification circuit 230 may be reduced (and/or avoided) by optionally setting the nominal value of the predefined first threshold such that the highest possible value of the predefined first threshold within its uncertainty interval substantially coincides with the minimum library limit of the first voltage 201. As a lower inaccuracy for the second verification circuit 260 may be easier to implement than for the first verification circuit 230, manufacturing tolerances and/or manufacturing efforts for the first verification circuit 230 and thus for the electric device 200 can be relaxed while still providing reliable monitoring of the first and the second voltage due to the lower inaccuracy of the second verification circuit 260.

For example, an inaccuracy of the second threshold can be smaller than half (or smaller than a quarter, a smaller than an eighth, or smaller than ½s) an inaccuracy of the first threshold.

The power-supply circuit 220 can comprise a (first) bandgap voltage reference sub-circuit configured to provide a (first) reference voltage. Furthermore, the power-supply circuit 220 can be configured to derive the first voltage 201 from the (first) reference voltage. A bandgap kernel of the (first) bandgap voltage reference sub-circuit can correspond to a bandgap kernel of the bandgap comparator of the first verification circuit 230. This can reduce false alarms triggered by the first verification circuit 230 and/or the non-detection of failures of the first voltage 201.

For example, both the first voltage 201 and the predefined (first) threshold of the first verification circuit 230 can depend on (e.g., vary with) temperature and/or manufacturing variations. As the power-supply circuit 220 can derive the first voltage 201 from the (first) bandgap voltage reference sub-circuit that comprises a bandgap kernel corresponding to that of the bandgap comparator, the first voltage 201 may be correlated with the predefined (first) threshold of the bandgap comparator versus temperature and/or manufacturing variations. That is to say, if the (first) reference voltage and hence the first voltage 201 increase or decrease due to manufacturing variations and/or temperature changes, the predefined (first) threshold may increase or decrease by substantially the same factor (and/or the same amount). Consequently, even in the presence of manufacturing tolerances and/or temperature changes, a difference between a target value of the first voltage 201 and the predefined (first) threshold may remain substantially constant.

For example, a circuit schematic of the bandgap kernel of the (first) bandgap voltage reference sub-circuit of the power-supply circuit 220 can correspond to (e.g., be equal to) a circuit schematic of the bandgap kernel of the bandgap comparator of the first verification circuit 230. That is to say, the bandgap kernel of the (first) bandgap voltage reference sub-circuit may comprise electrical elements of the same type (e.g., separated but the same elements) as the bandgap kernel of the bandgap comparator. Additionally, the electrical elements of the bandgap kernel of the (first) bandgap voltage reference sub-circuit may be electrically connected in the same configuration as the electrical elements of the bandgap kernel of the bandgap comparator.

Furthermore, the electrical elements of the bandgap kernel of the (first) bandgap voltage reference sub-circuit and the electrical elements of the bandgap kernel of the bandgap comparator may be similarly (and/or identically) dimensioned. For example, the dimensions of the circuit elements of the bandgap kernel of the (first) bandgap voltage reference sub-circuit may differ by less than a factor of 2 (or less than a factor of 1.5, or less than a factor of 1.1) from corresponding dimensions of corresponding circuit elements of the bandgap kernel of the bandgap comparator. This can further enhance the correlation of the first voltage 201 with the predefined (first) threshold of the first verification circuit 230. For instance, a resistor of the bandgap kernel of the (first) bandgap voltage reference sub-circuit may have a resistance differing by a factor less than 2 (e.g., being at most twice as large or at least half as large) from the resistance of a corresponding resistor of the bandgap kernel of the bandgap comparator. A bipolar transistor of the bandgap kernel of the (first) bandgap voltage reference sub-circuit may have an emitter area differing by a factor less than 2 (e.g., being at most twice as large or at least half as large) from the emitter area of a corresponding bipolar transistor of the bandgap kernel of the bandgap comparator.

Additionally, a layout of the bandgap kernel of the (first) bandgap voltage reference sub-circuit of the power-supply circuit 220 can correspond to a layout of the bandgap kernel of the bandgap comparator of the first verification circuit 230. For example, the electrical elements of the bandgap kernel of the (first) bandgap voltage reference sub-circuit can have the same orientation in the layout and/or the same geometrical dimensions (neglecting manufacturing tolerances) as the electrical elements of the bandgap kernel of the bandgap comparator. This can further enhance the correlation of the first voltage 201 with the predefined (first) threshold of the first verification circuit 230 over temperature and/or manufacturing variations. Additionally or alternatively, the (first) bandgap voltage reference sub-circuit and the bandgap comparator can optionally be integrated into a same integrated circuit (IC) of the electric device 200.

The power supply circuit 220 can comprise a second bandgap voltage reference sub-circuit configured to provide a second reference voltage. Moreover, the power-supply circuit can be configured to derive the second voltage 202 from the second reference voltage. A bandgap kernel of the second bandgap voltage reference sub-circuit can correspond to the bandgap kernel of the first bandgap voltage reference sub-circuit. As the power supply circuit 220 can derive the first voltage 201 from the first reference voltage of the first bandgap voltage reference sub-circuit and the second voltage 202 from the second reference voltage of the second bandgap voltage reference sub-circuit and because the bandgap voltage reference sub-circuits can comprise corresponding bandgap kernels, the first voltage 201 can be correlated to the second voltage 202.

For example, both the first voltage 201 and the second voltage 202 can depend on (e.g., vary with) manufacturing and/or temperature variations. Due to their correlation however, the first voltage 201 and the second voltage 202 can increase or decrease in course of manufacturing and/or temperature variations by substantially the same factor (and/or the same amount). This can reduce the inaccuracy of the second verification circuit 260 when comparing the first voltage 201 with the second voltage 202 (e.g., when performing a relative check of the first voltage 201 and the second voltage 202 with respect to each other). For example, this allows checking whether the first voltage 201 and/or the second voltage 202 deviate from their respective target values due to malfunctions of the electric device 200 rather than due to manufacturing and/or temperature variations.

For example, a circuit schematic of the bandgap kernel of the second bandgap voltage reference sub-circuit of the power-supply circuit 220 can correspond to (e.g., be equal to) a circuit schematic of the bandgap kernel of the first bandgap voltage reference sub-circuit of the power-supply circuit 220.

Additionally, the dimensions of the circuit elements of the bandgap kernel of the second bandgap voltage reference sub-circuit may differ by less than a factor of 2 (or less than a factor of 1.5, or less than a factor of 1.1) from corresponding dimensions of corresponding circuit elements of the bandgap kernel of the first bandgap voltage reference sub-circuit.

Additionally, a layout of the bandgap kernel of the second bandgap voltage reference sub-circuit can correspond to a layout of the bandgap kernel of the first bandgap voltage reference sub-circuit.

The first and the second bandgap voltage reference sub-circuit can optionally be integrated into a same integrated circuit (IC) of the electric device 200.

Throughout the present disclosure, a bandgap kernel (e.g., of a bandgap comparator and/or of a bandgap voltage reference sub-circuit) is understood as an electronic circuit comprising at least a first bipolar transistor and a second bipolar transistor and a resistor. During operation of the bandgap-kernel, the base of the first bipolar transistor and the base of the second bipolar transistor are at the same electric potential. Furthermore, during operation of the bandgap-kernel, a first terminal of the resistor and the emitter of the first bipolar transistor are at the same electric potential. Furthermore, the emitter of the second bipolar transistor is configured to be at the same electric potential as a second, different terminal of the resistor at least during one operating state of the bandgap kernel, which is different to an off-state of the bandgap kernel. Furthermore, a first current density of the first bipolar transistor differs from a second current density of the second bipolar transistor by a predefined factor at least during the operating state, in which the emitter of the second bipolar transistor is at the same electric potential as the second terminal of the resistor. This predefined factor depends on at least one of the ratio of an emitter area of the first bipolar transistor to an emitter area of the second bipolar transistor and the ratio of a first current being injected into the first bipolar transistor to a second current being injected into the second bipolar transistor during operation of the bandgap-kernel.

A bandgap kernel of a bandgap voltage reference sub-circuit can be operated in a closed-loop configuration. In an on-state of this bandgap kernel, the emitter of the second bipolar transistor of the bandgap-kernel can be at the same electric potential as the second terminal of the resistor of the bandgap-kernel due to the closed-loop. This can be accomplished by establishing an electrically conductive connection and/or by providing a virtual short circuit between the emitter of the second bipolar transistor and the second terminal of the resistor. Due to the closed-loop, an output voltage of the bandgap kernel of a bandgap voltage reference sub-circuit can have strongly reduced temperature dependence and may be used as a reference voltage.

A bandgap kernel of a bandgap comparator can be operated in an open-loop configuration such that the emitter of the second bipolar transistor of the bandgap-kernel of the bandgap comparator might not be constantly held at the electric potential of the second terminal of the resistor. However, depending on the input voltage of the bandgap comparator this may be the case and reflect the situation when the first internal voltage can equal the second internal voltage of the bandgap comparator.

The second verification circuit 260 can comprise a comparator. A first sensing terminal of the comparator can be connected to the first input terminal of the second verification circuit 260. A second sensing terminal of the comparator can be connected to the second input terminal of the second verification circuit 260. An input offset voltage of the comparator can correspond to (e.g., be equal to) a predefined threshold (e.g., the predefined second threshold) for comparing the first voltage with the second voltage.

Optionally, the input offset voltage of the comparator can be generated by a bandgap voltage reference sub-circuit of the second verification circuit 260 and a current mirror sub-circuit of the second verification circuit 260 across an input resistor of the comparator. The input resistor can be coupled between the first and the second sensing terminal of the comparator. Using a bandgap voltage reference sub-circuit can support generating accurately the input offset voltage thus decreasing the inaccuracy of the second verification circuit 260 for comparing the first voltage 201 with the second voltage 202. The used bandgap voltage reference sub-circuit can be a third bandgap voltage reference sub-circuit separated from the optional first and second bandgap voltage reference sub-circuit of the power supply circuit 220. Alternatively, the first or the second bandgap voltage reference sub-circuit can be used to generate the input offset voltage. For further decreasing the inaccuracy of the second verification circuit 260, a bandgap kernel of the bandgap voltage reference sub-circuit of the second verification circuit 260 can correspond to (or be one and the same as) a respective bandgap kernel of the first and/or the second bandgap voltage reference sub-circuit of the power supply circuit 220. In this way, the input offset voltage may be correlated to the first voltage 201 and/or the second voltage 202.

Additionally, the input resistor of the comparator of the second verification circuit 260 can correspond to a reference resistor of the (third) bandgap voltage reference sub-circuit of the second verification circuit 260 (or to reference resistor of the first or the second bandgap voltage reference sub-circuit of power supply circuit 220). The reference resistor can be configured to generate a reference current of the current mirror sub-circuit of the second verification circuit 260. A mirrored current of the current mirror sub-circuit can flow through the input resistor.

For example, the reference resistor can be electrically connected between an output of the (third) reference voltage of the bandgap voltage reference sub-circuit of the second verification circuit 260 and a reference branch of the current mirror sub-circuit. This way, the reference resistor can generate the reference current of the current mirror sub-circuit from the (third) reference voltage. This reference current can than cause the mirrored current of the current mirror sub-circuit with a magnitude depending on a ratio of cross sectional areas of the transistors of the current mirror sub-circuit. Since the mirrored current can flow through the input resistor, the mirrored current can cause a voltage drop corresponding to (e.g., being) the input offset voltage across the input resistor.

The input resistor can correspond to the reference resistor in terms of resistor type, dimensions, and/or layout. For example, the input resistor and the reference resistor can be of the same resistor type (e.g., polysilicon resistors within an integrated circuit, or thin film or thick film resistors on a common substrate, etc.). Furthermore, a resistance of the input resistor may differ from the resistance of the reference resistor by less than a factor of 5 (or by less than a factor of 3. or by less than a factor of 2). This factor can include a current mirror ratio of the current mirror sub-circuit. For example, if the current mirror ratio is 10:1, then a 10 times higher/smaller resistance can compensate this ratio. On top, there can be the factor by which the input resistor can maximally differ from the resistance of the reference resistor.

Additionally, an orientation of the input resistor and an orientation of the reference resistor can be the same (neglecting manufacturing tolerances) in the layout of the second verification circuit 260. Corresponding geometrical dimensions of the input resistor and the reference resistor can differ by less than a factor of 5 (or less than a factor of 3, or less than a factor of 2). This factor can include the current mirror ratio of the current mirror sub-circuit. For example, if the current mirror ratio is 10:1, then a 10 times larger/smaller dimensions can compensate this ratio. On top, there can be the factor by which the corresponding geometrical dimensions of the input resistor and the reference resistor can maximally differ.

Due to the above described measures, the input resistor and the reference resistor may vary by the same factor in presence of manufacturing and/or temperature variations. Hence, a ratio of the input resistor to the reference resistor may remain unaffected (or be less affected) by manufacturing and/or temperature variations. As the input reference voltage (that can eventually be derived from the reference voltage of the bandgap voltage reference sub-circuit of the second verification circuit 260) may rather depend on the ratio of the input resistor to the reference resistor than on the resistance of the input resistor itself, the input reference voltage may be less affected by manufacturing and/or temperature variations. This can decrease the inaccuracy of the second verification circuit 260 when comparing the first voltage 201 with the second voltage 202.

The comparator can comprise a differential input amplifier and optionally additional amplification stages and/or filtering circuitry, for example. The first and the second sensing terminal of the comparator can, for example, be the bases or gates of a first and a second transistor of the differential input amplifier, respectively. The comparator can be configured to provide the second output signal 212 at an output port of the comparator. For example, when the first voltage 201 is larger than the second voltage 202 plus the input offset voltage, the output signal 212 can be at a high (digital) level and, when the first voltage 201 is smaller than the second voltage 202 plus the input offset voltage, the output signal 212 can be at a low (digital) level (or vice versa).

The second verification circuit can further comprise a second comparator. A first sensing terminal of the second comparator can be connected to the first input terminal of the second verification circuit 260. A second sensing terminal of the second comparator can be connected to the second input terminal of the second verification circuit 260. Additionally, an input offset voltage of the second comparator can correspond to the predefined (second) threshold for comparing the first voltage 201 with the second voltage 202 and can be generated similarly (or in the same way) as described above for the first comparator of the verification circuit 260.

For example, a power supply terminal of the first comparator of the second verification circuit 260 can be connected to the first voltage 201, while a power supply terminal of the second comparator of the second verification circuit 260 can be connected to the second voltage 202. This can provide redundancy to the monitoring of the first and the second voltage and can hence make the operation of the electric device 200 more reliable. For example, if there is a failure of the first voltage 201 which may cause the first comparator to become inoperable, a relative check between the first voltage 201 and the second voltage 202 can still be performed by the second comparator.

Additionally or alternatively, the first comparator of the second verification circuit 260 can be configured to generate the second output signal 212 based on whether the first voltage 201 exceeds the second voltage 202 by more than the predefined (second) threshold. The second comparator can be configured to generate the second output signal 212 based on whether the first voltage 201 falls below the second voltage 202 by more than the predefined (second) threshold (or by more than a differently predefined threshold). In this way, the first comparator may be used to detect an overvoltage (e.g., a too high level) of the first voltage 201, while the second comparator can be used to detect an undervoltage (e.g., a too low level) of the first voltage 201. However, as the second verification circuit 260 can perform a relative check of the first and the second voltage 201, 202, the first comparator may be used to detect an undervoltage of the second voltage 202, while the second comparator can be used to detect an overvoltage of the second voltage 202.

According to an example, the second verification circuit 260 comprises four comparators configured for comparing the first voltage 201 with the second voltage 202. These four comparators can be thought of as two pairs, one of the pairs being power supplied by the first voltage 201 and the other being power supplied by the second voltage 202. Within each pair, one comparator can detect an overvoltage of the first voltage 201 (and/or an undervoltage of the second voltage 202) and the other comparator can detect an undervoltage of the first voltage 201 (and/or an overvoltage of the second voltage 202, respectively). This can enable the second verification circuit 260 to detect both over- and undervoltages of the first and the second voltage 201, 202 and can thus enhance the reliability of the electric device 200.

Additionally or alternatively to the use of comparators within the second verification circuit 260, the second verification circuit 260 can comprise an analog-to-digital converter (ADC). An input sampling terminal of the ADC can be connected to the first input terminal of the second verification circuit 260 (or to the second input terminal of the second verification circuit 260).

According to an embodiment, the second verification circuit 260 comprises a first and a second ADC. An input sampling terminal of the first ADC can be connected to the first input terminal of the second verification circuit 260. An input sampling terminal of the second ADC can be connected to the second input terminal of the second verification circuit 260.

A reference voltage of an ADC of the second verification circuit 260 can be generated by a bandgap kernel of the electric device 200 (e.g., by a bandgap kernel of the bandgap comparator of the first verification circuit 230, by a bandgap kernel of a bandgap voltage reference sub-circuit of the power supply circuit 220, and/or by a bandgap kernel of a bandgap voltage reference sub-circuit of the second verification circuit 260). This bandgap kernel for providing the reference voltage of the ADC (or the ADCs) can correspond to the bandgap kernel of the bandgap comparator and/or to the bandgap kernels of bandgap voltage reference sub-circuits of the power supply circuit 220, for example.

The ADC (or the ADCs) of the second verification circuit 260 can provide a digital multi-bit signal for comparison with a predefined digital threshold. This predefined digital threshold (e.g., a comparison signal) can be correlated with reference voltages of bandgap voltage reference sub-circuits of the of the power supply circuit 220 and/or with the first and/or the second internal voltage of the bandgap comparator of the first verification circuit 230. Thus temperature variations and manufacturing spread can be at least partially compensated. The ADC (or the ADCs) of the second verification circuit 260 can be configured to generate the second output signal 212 if the first voltage 201 (and/or the second voltage 202) rises above and/or falls below the predefined digital threshold.

In contrast to a comparison with a predefined threshold of a bandgap comparator the digital multi-bit signal of an ADC can provide a result with higher resolution (more bits) and can offer further possibilities for digital signal processing, e.g. low-pass or band-pass filtering. Short spikes of supply voltages (e.g., the first voltage 201 and/or the second voltage 202) can be filtered depending on duration and/or amplitude of spike voltages. These spikes could be caused by external supply disturbances and/or could be generated by an internal switching digital part.

In some embodiments, the power supply circuit 220 is configured to derive a plurality of voltages from the (first) reference voltage provided by the (first) bandgap voltage reference sub-circuit of the power supply circuit 220. Moreover, the second verification circuit 260 can comprise a star connected resistive network. Each of the plurality of voltages can be connected to a respective input terminal of the star connected resistive network. A central node of the star connected resistive network can be connected to a sensing terminal of a comparator (e.g., the first or the second comparator) of the second verification circuit 260.

In this way, a higher number of voltages provided by the power supply circuit 220 can be monitored without increasing the number of comparators of the second verification circuit 260. This can decrease the size and thus manufacturing costs of the electric device 200. For example, the star connected resistive network comprises a resistor connected between the central node and ground potential and comprises a plurality of other resistors (herein referred to as voltage divider resistors) that are connected between the respective input terminals of the star connected resistive network and the central node of the star connected resistive network. In other words, each of the voltage divider resistors can comprise two terminals, one terminal being connected to the central node and the other terminal being connected to a respective input terminal of the star connected resistive network. A variation of, for example, one of the plurality of voltages at a respective input terminal of the star connected resistive network can then cause a variation of the voltage of the central node. This can be sensed by the comparator to which the central node of the star connected resistive network is connected to.

Additionally, for a star connected resistive network comprising a plurality of voltage divider resistors, each of the voltage divider resistors being connected between a respective input terminal and the central node of the star connected resistive network, respective quotients of each of the plurality of voltages to a respective voltage divider resistor, to which the voltage is connected to, can be equal. In other words, each of the plurality of voltages can have a respective target value, which is the desired value of that voltage. Each of the plurality of voltages is connected to an own, separate voltage divider resistor. The resistances of the voltage divider resistors can then be designed such that each of the voltage target values divided by the resistance of the voltage divider resistor to which this voltage is connected to are equal (neglecting manufacturing tolerances). This can allow that each of the plurality of voltages may deviate from its target value by the same factor before the comparator connected to the star connected resistive network may trigger (e.g., switch the second output signal 212).

The combination circuit 290 can comprise respective input ports for the first output signal 211 and the second output signal 212. In addition, the combination circuit 290 can comprise logic circuitry (implemented in hardware and/or in software) to analyze the first and the second output signal 211, 212 and to generate the third output signal 213 based on that analysis.

For example, the third output signal 213 can be at least one of a warning signal, a reset signal, a diagnosis signal, and an interrupt signal. According to an embodiment, a too high deviation of the first voltage 201 indicated by the first verification circuit 230 may be regarded as more severe than a too high deviation between the first and the second voltage detected by the second verification circuit 260, because the first verification circuit 230 can evaluate the absolute level of the first voltage (e.g., referenced to ground potential). If, for example, the first output signal 211 indicates that the first voltage 201 has fallen below the predefined first threshold, the third output signal 213 can be a reset signal causing a reset (e.g., a reboot) of the electric device 200 or can be an interrupt signal causing the electric device 200 to pause certain operations. This can reestablish a correct operation of the electric device 200.

If, for example, the second output signal 212 indicates a too high deviation between the first and the second voltage 201, 202, the third output signal 213 can be a warning signal which can warn a user and/or other circuit parts of the electric device 200 that the electric device 200 may start operating unreliably. The third output signal 213 can also be a diagnosis signal providing information to the user and/or to other circuit parts of the electric device 200 which of the monitored voltages (e.g., the first and/or the second voltage) shows a too high deviation and whether this deviation is referenced to ground potential or relative to another voltage.

The power supply circuit 220, the first verification circuit 230, the second verification circuit 260, and the combination circuit 290 can be integrated into an integrated circuit of the electric device 200. For example, the electric device 200 can be an integrated circuit. As, explained above, this can increase a correlation over temperature and/or manufacturing variations between the first voltage 201 and the second voltage 202 and the thresholds against which the first and/or the second voltage are compared to.

The predefined first threshold against which the first voltage 201 can be compared to can for example, amount to less than 95% (or less than 90%, or less than 80%, or less than 60%) of the first voltage 201 and/or to more than 50% (or more than 65%, or more than 75%, or more than 90%, or more than 110%) of the first voltage 201.

The predefined second threshold by which the first voltage 201 and the second voltage 202 may deviate from each other before causing the second output signal 212 to indicate a too high deviation can amount to less than 20% (or less than 10%, or less than 5%, or less than 2%) of the first or the second voltage and/or to more than 0.1% (or more than 3%, or more than 7%, or more than 15%) of the first or the second voltage.

The electric device 200 can be a sensor device used in applications requiring high functional safety, such as automotive, aeronautical, and/or medical applications. In some examples, the electric device 200 can be a central computing unit, an application specific integrated circuit, and/or a system-on-chip device. Furthermore, the electric device 200 can be used in power switches, power regulators, airbag system and/or multi-channel monitoring systems in automotive and/or medicine systems, for example.

Even though in the context of the electric device 200 of FIG. 2, the explanations are mostly made with reference to monitoring two voltages (e.g., the first voltage 201 and the second voltage 202), the electric device 200 may be configured for monitoring more voltages without leaving the scope of the present disclosure. To this end, corresponding circuitry may be added, for example, additional bandgap comparators of the first verification circuit 230 and/or additional comparators of second verification circuit 260. Additionally, each of the voltages may be monitored by a separate bandgap comparator.

Figure 3B:
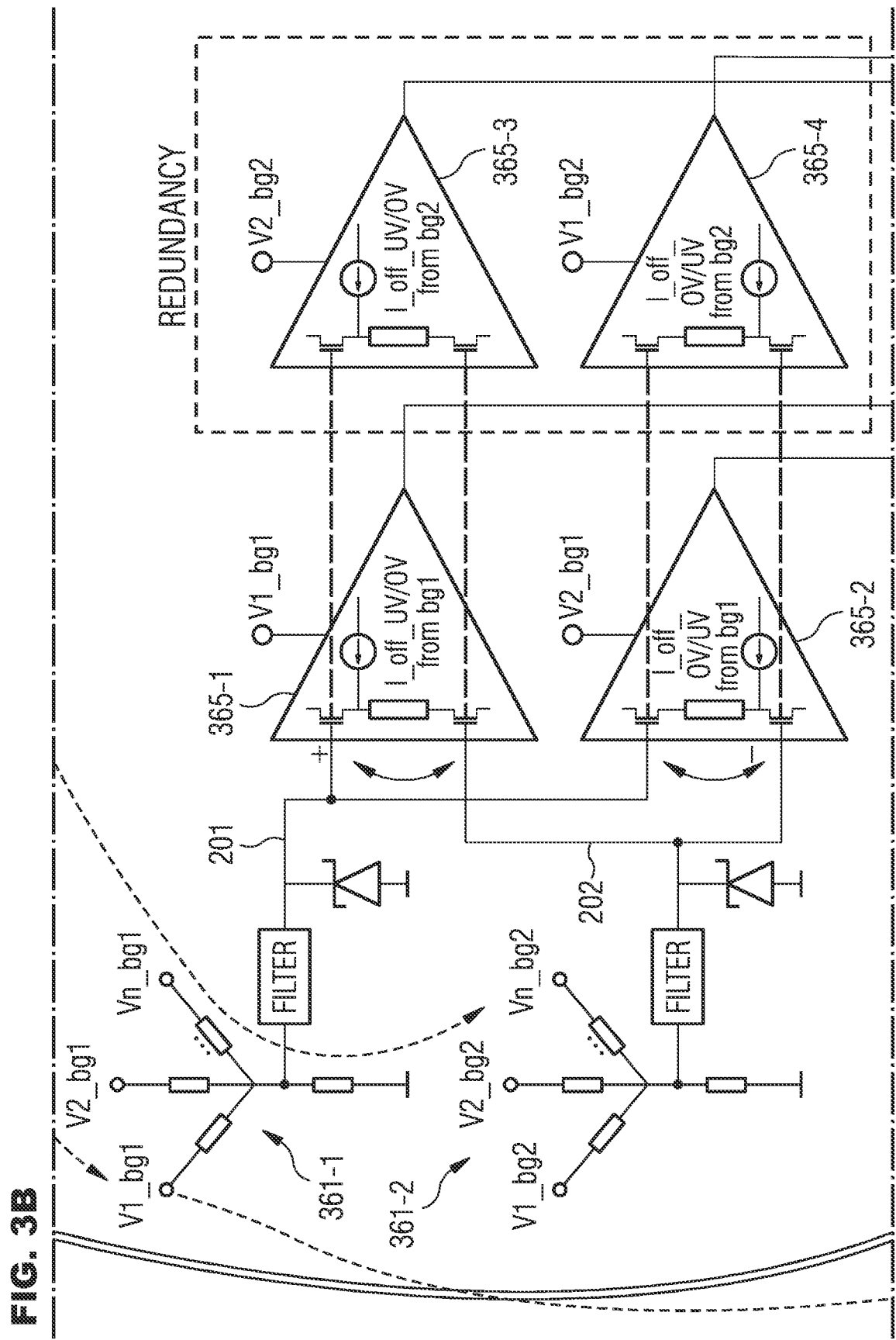
Figure 3C:
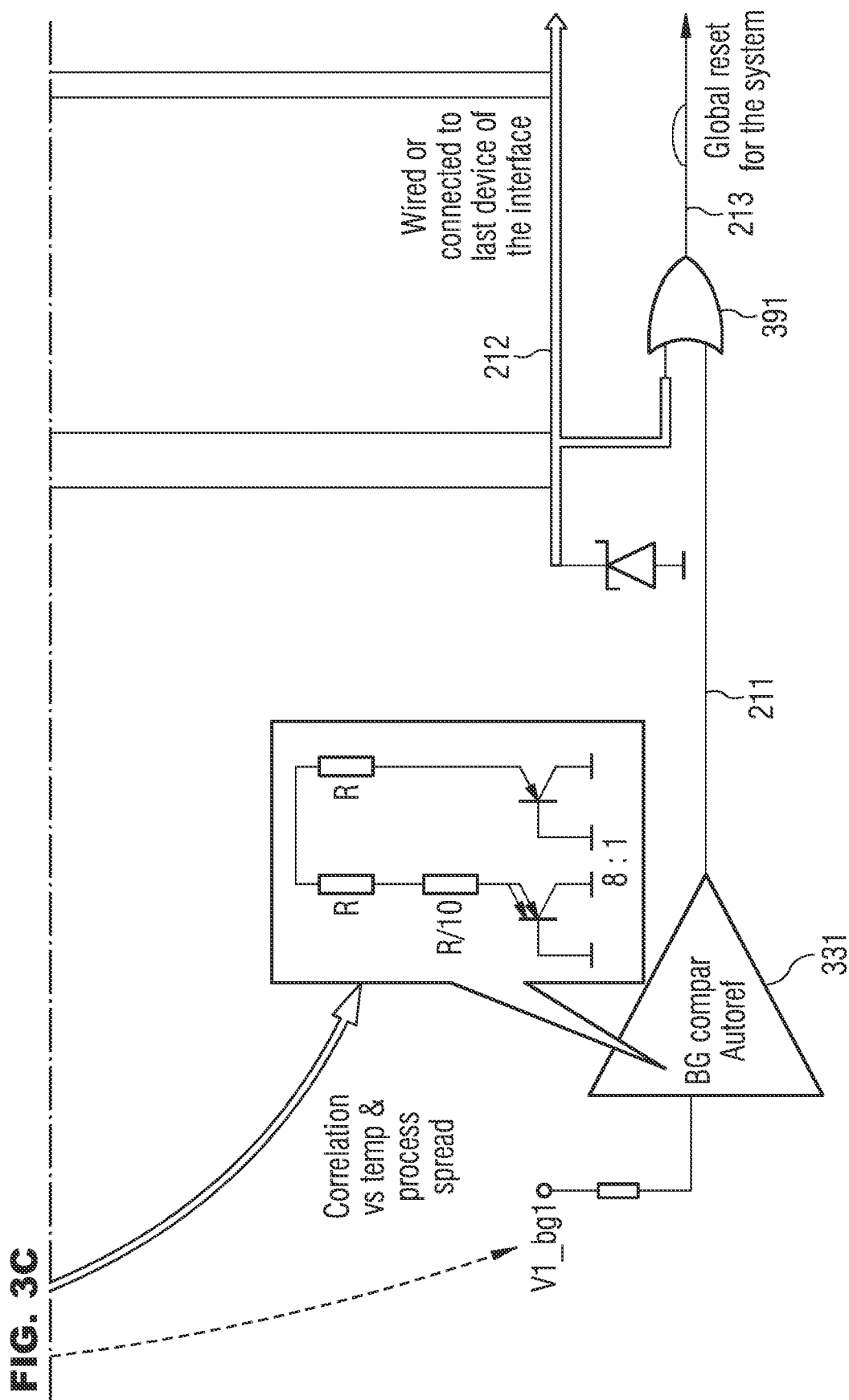

FIGS. 3A-3C show a circuit schematic of an electric device 300 over three parts. The electric device 300 may be similar to the electric device 200 of FIG. 2. The electric device 300 comprises a power supply circuit that is configured to generate a first reference voltage $V_{ref\_bg1}$ using a first bandgap voltage reference sub-circuit and to generate a second reference voltage $V_{ref\_bg2}$ using a second bandgap voltage reference sub-circuit. The first and the second bandgap voltage reference sub-circuit comprise respective bandgap kernels corresponding to each other. This can cause a correlation between the first reference voltage $V_{ref\_bg1}$ and the second reference voltage $V_{ref\_bg2}$ as well as between a first plurality of voltages $V_{1\_bg1}$ to $V_{n\_bg1}$ derived from the first reference voltage $V_{ref\_bg1}$ and a second plurality of voltages $V_{1\_bg2}$ to $V_{n\_bg2}$ derived from the second reference voltage $V_{ref\_bg2}$. The two pluralities of voltages may comprise the same or different numbers of voltages. The power supply circuit comprises a first power management unit 321-1 to derive the first plurality of voltages $V_{1\_bg1}$ to $V_{n\_bg1}$ from the first reference voltage $V_{ref\_bg1}$ and a second power management unit 321-2 to derive the second plurality of voltages $V_{1\_bg2}$ to $V_{n\_bg2}$ from the second reference voltage $V_{ref\_bg2}$. To this end, the first and the second power management unit 321-1, 321-2 can comprise voltage regulators (e.g., linear and/or switched regulators) and/or voltage divider circuitry.

The electric device 300 further comprises a first verification circuit with a bandgap comparator 331. A voltage $V_{1\_bg1}$ derived from the first reference voltage $V_{ref\_bg1}$ is connected to sensing terminal of the bandgap comparator 331. This sensing terminal is also the power supply terminal of the bandgap comparator 331. The bandgap comparator 331 is configured to provide a first output signal 211 of the first verification circuit to an OR-gate 391 of a combination circuit of the electric device 300. The bandgap comparator 331 comprises a bandgap kernel corresponding to the bandgap kernel of the first bandgap voltage reference sub-circuit of the power supply circuit so that a predefined threshold of the bandgap comparator 331, against which the voltage $V_{1\_bg1}$ can be compared, can be correlated with the first reference voltage $V_{ref\_bg1}$ and hence with the voltage $V_{1\_bg1}$ itself versus temperature and/or manufacturing tolerances.

Each of the first plurality of voltages $V_{1\_bg1}$ to $V_{n\_bg1}$ is connected to a respective input terminal of a first star connected resistive network 361-1 of the electric device 300. Respective voltage divider resistors of the first star connected resistive network 361-1 are connected between the respective input terminals and a central node of the first star connected resistive network 361-1. Another resistor of the first star connected resistive network 361-1 is connected between the central node and ground of the electric device 300. The central node of the first star connected resistive network 361-1 is connected via an optional filter and a shunt diode to a first sensing terminal of a first comparator 365-1 of a second verification circuit of the electric device 300 and to a first sensing terminal of a second comparator 365-2 of the second verification circuit. The filter can provide robustness in case of electromagnetic compatibility (EMC) events. The shunt diode can provide a protection for the second verification circuit and the power supply circuit against overvoltages.

Each of the second plurality of voltages $V_{1\_bg2}$ to $V_{n\_bg2}$ is connected to a respective input terminal of a second star connected resistive network 361-2 of the electric device 300. The second star connected resistive network 361-2 can be similar to the first star connected resistive network 361-1. The central node of the second star connected resistive network 361-2 is connected via another optional filter and another shunt diode to a second sensing terminal of the first comparator 365-1 and to a second sensing terminal of the second comparator 365-2.

The voltage of the central node of the first star connected resistive network 361-1 can correspond to the first voltage 201 of the electric device 200 of FIG. 2 and is for simplicity also referred to as the first voltage 201 within the context of FIGS. 3A-3C. The voltage of the central node of the second star connected resistive network 361-2 can correspond to the second voltage 202 of the electric device 200 of FIG. 2 and is for simplicity also referred to as the second voltage 202 within the context of FIGS. 3A-3C.

In the example of the electric device 300, the voltage divider resistors of the first and the second star connected resistive network 361-1, 361-2 are trimmed such that the target value of the first voltage 201 equals the target value of the second voltage 202. In other examples of the present disclosure, voltage divider resistors of the first and the second star connected resistive network 361-1, 361-2 can also be trimmed such that the respective target values of the first and the second voltage differ from each other.

The first comparator 365 is configured to compare the first voltage 201 with the second voltage 202 and thus to perform a relative check between the first and the second voltage. In particular, the first comparator 365-1 is configured to detect an undervoltage of the first voltage 201 with respect to the second voltage 202 and/or to detect an overvoltage of the second voltage 202 with respect to the first voltage 201. To this end, the first and the second sensing terminal of the first comparator are realized by a first and a second transistor, respectively (here field effect transistors are employed, but also bipolar transistors can be used analogously). The first voltage 201 is connected to the gate of the first transistor and the second voltage 202 is connected to the gate of the second transistor. An input resistor is coupled between the source (or drain) of the first transistor and the source (or drain) of the second transistor. The first comparator 365-1 is configured to feed a current into its input resistor, which can cause a higher electric potential at the source of the first transistor than at the source of the second transistor. This potential difference between the two source terminals can be the input offset voltage of the first comparator 365-1. By designing the amount of current flowing into this input resistor and by designing the resistance of the input resistor, the input offset voltage can be predefined and hence correspond (e.g., be) a predefined (second) threshold for comparing the first voltage 201 with the second voltage 202. If the first voltage can fall below the second voltage 202 by at least the magnitude of the input offset voltage (and/or if the second voltage 202 can rise above the first voltage 201 by at least the magnitude of the input offset voltage), the first comparator may switch its output signal to indicate an undervoltage of the first voltage 201 (and/or an overvoltage of the second voltage 202, respectively). The current fed into the input resistor can be supplied by a current source of the first comparator 365-1. For example, this current source can be comprise a current source sub-circuit with a reference current being supplied from the first reference voltage $V_{ref\_bg1}$ (or from any voltage $V_{1\_bg1}$ to $V_{n\_bg1}$ derived from the reference voltage $V_{ref\_bg1}$) through a reference resistor and a mirrored current being the current fed into the input resistor. In this way, the first voltage 201 that is derived from the first reference voltage $V_{ref\_bg1}$ and the input offset voltage of the first comparator 365-1 that is also derived from the first reference voltage $V_{ref\_bg1}$ can be correlated with each other. This can reduce the predefined (second) threshold from being altered relative to the first voltage 201 by temperature and/or manufacturing variations of the electric device 300. As explained in the context of FIG. 2, the reference resistor can optionally correspond to the input resistor, which can decrease the inaccuracy of the predefined (second) threshold.

The second comparator 365-2 is configured to detect an overvoltage of the first voltage 201 with respect to the second voltage 202 and/or to detect an undervoltage of the second voltage 202 with respect to the first voltage 201. To this end, the source (or drain) of a transistor of the second sensing terminal of the second comparator 365-2 may be at a higher electric potential than the source (or drain) of a transistor of the first sensing terminal of the second comparator 365-2. Again, this can be accomplished an input resistor of the second comparator 365-2 and a current fed into this input resistor. The resulting input offset voltage of the second comparator 365-2 can be the same (neglecting manufacturing tolerances) as the input offset voltage of the first comparator 365-1, so that the predefined (second) threshold can also be implemented at the second comparator 365-2. Alternatively, the respective input offset voltages of the first and the second comparator 365-1, 365-2 may differ from each other, so that different thresholds may be implemented at the first and the second comparator 365-1, 365-2.

The second comparator 365-2 may comprise further circuit elements according to those explained in the context of the first comparator 365-1.

The second comparator 365-2 can then generate an output signal to indicate an overvoltage of the first voltage 201 with respect to the second voltage 202 (and/or an undervoltage of the second voltage 202 with respect to the first voltage 201). The output signal of the first and the second comparator are part of a second output signal 212 of the second verification circuit. For example, the second output signal 212 may comprise voltages on a plurality of conductors (e.g., wires and/or conductor traces) with each voltage being an output signal of a comparator of the second verification circuit. Respective shunt diodes are connected to the output signals of the comparators of the second verification circuit in order to provide protection for the outputs of the comparators against overvoltages.

The second output signal 212 is connected to the OR-Gate 391 of the combination circuit. An output signal of the OR-Gate 391 can be the third output signal 213 which can be a reset signal and/or an interrupt signal and/or a warning signal. However, the combination circuit can comprise additional circuitry to provide additional information in terms of where a too high and/or a too low voltage have been detected by the first and/or the second verification. Hence, the third output signal can also be a diagnosis signal.

Respective power supply terminals of the first and the second comparator 365-1, 365-2 are connected to the voltages $V_{1\_bg1}$ and $V_{2\_bg1}$, respectively, that are derived from the first reference voltage $V_{ref\_bg1}$. This can enhance the reliability of the second verification circuit. For example, if the voltage $V_{1\_bg1}$ becomes too low to operate the first comparator 365-1, this can cause an undervoltage of the second voltage 202 at the second comparator 365-2. Since the second comparator 365-2 is still operable as it is power supplied from $V_{2\_bg1}$ and not from $V_{1\_bg1}$, the second comparator can indicate the failure of $V_{1\_bg1}$ by its output signal.

For redundancy, in case the reference voltage $V_{ref\_bg1}$ has a failure which can cause failures of both $V_{1\_bg1}$ and $V_{2\_bg1}$, the second verification circuit can optionally comprise a third comparator 365-3 and a fourth comparator 365-4 with respective power supply terminals being connected to the voltages $V_{1\_bg2}$ and $V_{2\_bg2}$, respectively, that are derived from the second reference voltage $V_{ref\_bg2}$. The third comparator 365-3 is configured to detect an undervoltage of the first voltage 201 with respect to the second voltage 202 (and/or an overvoltage of the second voltage 202 with respect to the first voltage 201). The fourth comparator 365-4 is configured to detect an overvoltage of the first voltage 201 with respect to the second voltage 202 (and/or an undervoltage of the second voltage 202 with respect to the first voltage 201). Respective output signals of the third and the fourth comparator 365-3, 365-4 can be part of the second output signal 212 of the second verification circuit.

For example, FIGS. 3A-3C show a supply diagnosis system 300 comprising a set of power management units 321-1, 321-2 providing one or more supply domains generated by at least two bandgap references having different typical levels, a bandgap comparator 331, and four cross-check comparators 365-1, 365-2, 365-3, 365-4. Each cross-check comparator can comprise a comparator core, a voltage divider for each supply domain to be monitored, an optional filter to provide robustness to EMC events, clamping devices at input and output of the comparators to protect the other domains and the next stage in case of overvoltage of overvoltage failure (desired in case of low-voltage transistors), and a logic gate 391 whose output can release/reset the whole system and/or whose output can provide a warning signal and/or a disabling signal. The bandgap comparator 331 can compare one supply against an internal bandgap. It can be autonomous, since it can be supplied with the supply to be monitored and it can be auto-referenced, since the threshold level can be defined by the internal bandgap.

In other words, the supply diagnosis system 300 is configured to perform an absolute check of at least one supply domain referenced to a bandgap circuit (e.g., a bandgap comparator 331) with less requirements for accuracy. On top, the supply diagnosis system 300 can perform a significantly more accurate cross check between different supply domains. The cross check can operate inside the specified operating range of each supply generator and can make a relative comparison instead of an absolute comparison to ground. The number of comparisons and used supplies provides a redundant information and signal (safe state) for an output to signalize it to a micro-processor (µP) or other system logic. A single error might not lead to unsafe state in the system.

Figure 4:
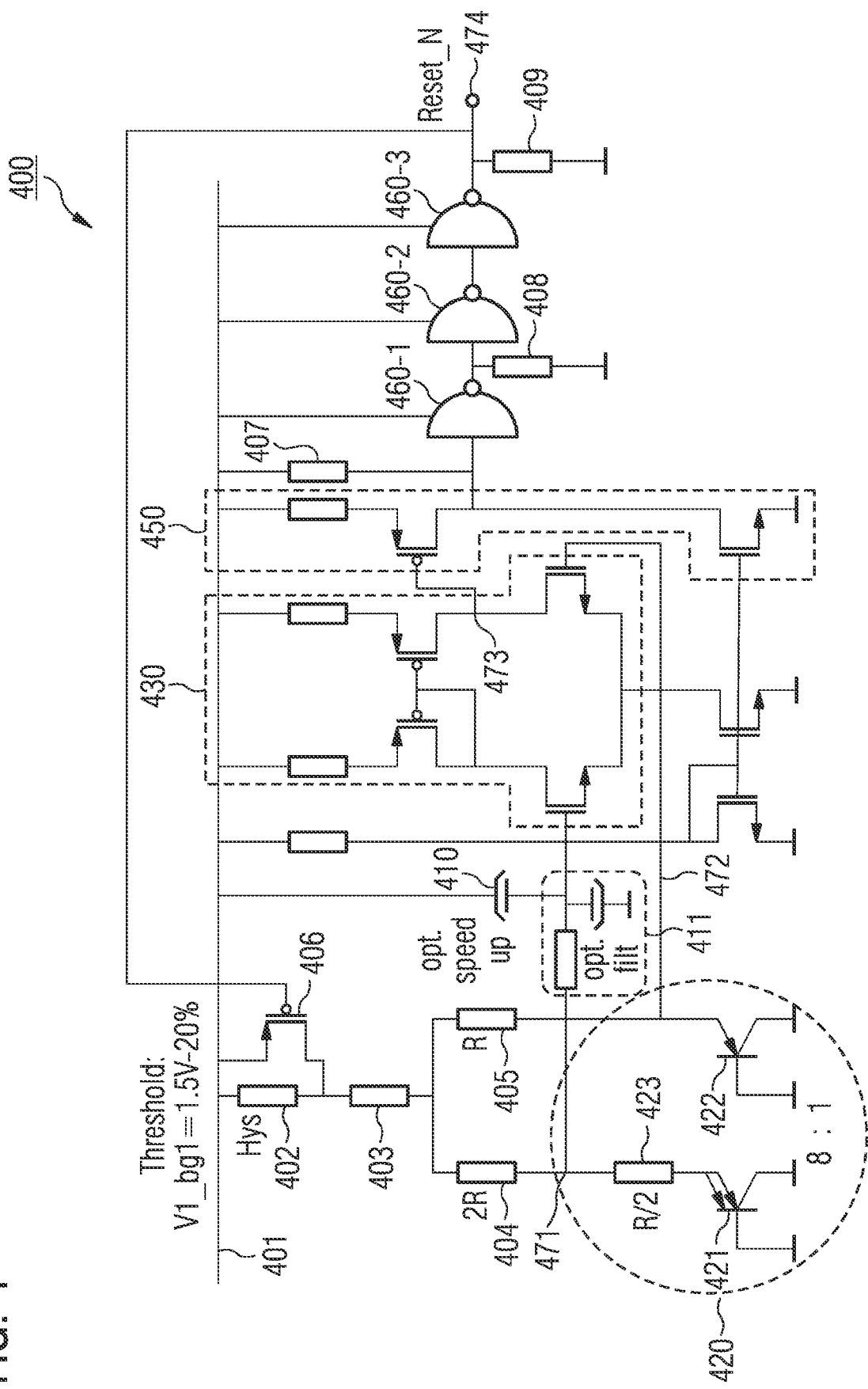
FIG. 4 shows a circuit schematic of a bandgap comparator.

FIG. 4 shows a circuit schematic of a bandgap comparator 400. The bandgap comparator 400 can, for example, be used within the first verification circuit of the electric devices 200, 300. The bandgap comparator 400 comprises a bandgap kernel 420, a differential amplifier 430, an output amplifier 450 and three inverters 460-1, 460-2, 460-3. A sensing terminal 401 of the bandgap comparator 400 coincides with a power supply terminal of the bandgap comparator 400.

The bandgap kernel 420 is configured to derive a first internal voltage 471 and a second internal voltage 472 from a voltage sensed at the sensing terminal 401. The bandgap kernel 420 is configured to decrease the first internal voltage 471 at a higher rate than the second internal voltage 472 with respect to a decreasing sensed voltage. To this end, the bandgap kernel 420 comprises a first bipolar transistor 421, a second bipolar transistor 422 and a resistor 423. Both the base of the first bipolar transistor 421 and the base of the second bipolar transistor 422 are connected to ground so that the base of the first bipolar transistor 421 can be at the same electric potential as the base of the second bipolar transistor 422 during operation of the bandgap kernel 420. Furthermore, the respective collectors of the first and second bipolar transistor 421, 422 are connected to ground. The emitter of the first bipolar transistor 421 is connected to a first terminal of the resistor 423 so that the first terminal of the resistor and the emitter of the first bipolar transistor 422 are at the same electric potential during operation of the bandgap kernel 420. The first internal voltage 471 corresponds to (e.g., is equal to) the electric potential of a second terminal of the resistor 423. Furthermore, the second internal voltage 472 corresponds to (e.g., is equal to) an electric potential of the emitter of the second bipolar transistor 422.

The first internal voltage 471 can then drop at least across the resistor 423 and the first bipolar transistor 421 (e.g., across the emitter-base-junction of the first bipolar transistor 421) to ground. The second internal voltage 472 can drop at least across the second bipolar transistor (e.g., across the emitter-base-junction of the second bipolar transistor 422) to ground. This can let the first internal voltage 471 to decrease at a higher rate than the second internal voltage with respect to a decreasing voltage sensed at the sensing terminal 401. When the sensed voltage is larger than a predefined threshold level of the bandgap comparator 400, the first internal voltage 471 can be larger than the second internal voltage 472 due to the voltage drop across the resistor 423. As the sensed voltage decreases, the voltage drop across the resistor 423 decreases at a higher rate than the voltage drop across the second bipolar transistor 422. Due to the emitter area of the first bipolar transistor 421 being larger (in this example eight times larger, but also other factors are possible) than the emitter area of the second bipolar transistor 422, the voltage drop across the first bipolar transistor can be sufficiently smaller than the voltage drop across the second bipolar transistor 422. At a certain level of the sensed voltage that is below the target value of the sensed voltage, the first internal voltage 471 can hence be equal to the second internal voltage 472. This level of the sensed voltage can correspond to the predefined threshold of the bandgap comparator 400 and can depend on (e.g., be predefined via) the resistance of the resistor 423 (and/or on the resistances of the resistors 402, 403, 404, 405 of the bandgap comparator connected between the bandgap kernel 420 and the sensing terminal 401) and/or the respective emitter areas of the first and second bipolar transistor 421, 422 of the bandgap kernel 420. In other words, in the operating state, where the first internal voltage equals the second internal voltage (and which is different to an off-state of the bandgap kernel), the emitter of the second bipolar transistor 422 is at the same electric potential as the second terminal of the resistor 423. When the voltage sensed at the sensing terminal 401 decreases further, the first internal voltage 471 can become smaller than the second internal voltage 472.

The decrease of the first internal voltage below the second internal voltage and thus the falling of the sensed voltage below the predefined threshold of the bandgap comparator 400 can be detected by the differential amplifier 430. To this end, the first internal voltage 471 is connected to a first input transistor of the differential amplifier 430 and the second internal voltage 472 is connected to a second input transistor of the differential amplifier 430. The output voltage 473 of the differential amplifier 430 can become larger (e.g., closer to the sensed voltage) when the first internal voltage 471 is larger than the second internal voltage 472 than when the first internal voltage 471 is smaller than the second internal voltage 472. The output amplifier 450 can inversely amplify the output voltage 473 of the differential amplifier 430 causing the input voltage of the first inverter 460-1 to become smaller when the first internal voltage 471 is larger than the second internal voltage 472. Due to the three inverters 460-1, 460-2, 460-3 being connected in series, a low voltage at the input of the first inverter 460-1 can result in a high voltage (e.g., close to the sensed voltage) at the output of the third inverter 460-3.

In summary, as long as the voltage sensed at the sensing terminal 401 is larger than the predefined threshold of the bandgap comparator 400, the first internal voltage 471 is larger than the second internal voltage 472. This causes the output voltage 474 of the bandgap comparator (e.g., of the third inverter 460-3) to be at a high level (e.g., approximately equal to the voltage sensed at the sensing terminal 401). On the other hand, as the voltage sensed at the sensing terminal 401 decreases below the predefined threshold of the bandgap comparator 400, the first internal voltage 471 decreases below the second internal voltage 472, which causes the output voltage 474 of the bandgap comparator to be at a low level (e.g., approximately equal to ground potential of the bandgap comparator 400).

The three inverters 460-1, 460-2, 460-3 can also serve to transform the analog output signal of the output amplifier 450 into a digital output signal 474 of the bandgap comparator 400 with clearly distinguishable digital levels. The pull-up resistor 407 connected to the input of the first inverter 460-1, the pull-down resistor 408 connected to the input of the second inverter 460-2, and the pull-down resistor 409 connected to the output of the third inverter 460-3 can provide a stable and defined output signal 474 of the bandgap comparator 400 during power-up (e.g., booting) of the bandgap comparator 400. For example, during power-up the output signal 474 can be at the low level.

An optional hysteresis loop circuit of the bandgap comparator comprises the resistor 402 connected between the sensing terminal 401 and the bandgap kernel 420. A transistor 406 (e.g., a p-channel metal-oxide-semiconductor field-effect transistor) of the hysteresis loop circuit is connected in parallel to the resistor 402 and can allow bypassing the resistor 402 depending on the output signal 474 of the bandgap comparator 400. To this end, the gate of the transistor 406 is connected to the output signal 474 of the bandgap comparator 400. When the output signal 474 is at a high level, the bypass can be deactivated which can cause the predefined threshold of the bandgap comparator 400 to be smaller than when the output signal 474 is at a low level and the bypass is activate. The optional hysteresis loop can thus stabilize the output signal 474 of the bandgap comparator 400, especially when the sensed voltage varies around the predefined threshold of the bandgap comparator 400.

An optional capacitor 410 connected between the sensing terminal 401 and the first input transistor of the differential amplifier 430 can create capacitive coupling between the sensed voltage and the first internal voltage 471. This can improve the dynamic behavior of the bandgap comparator 400. For example, a response time of the bandgap comparator 400 (e.g., the time it takes for the bandgap comparator to switch its output signal when the sensed voltage crosses the predefined threshold) can be reduced.

An optional filter 411 connected between the second terminal of the resistor 423 of the bandgap kernel 420 and the first input transistor of the differential amplifier 430 can reduce noise on the first internal voltage 471 and can thus prevent undesired switching of the bandgap comparator caused by noise.

For example, a possible implementation of a bandgap comparator 400 is depicted in FIG. 4. The bandgap core (e.g., the bandgap kernel 420) can define the switching level which can be sensed by an amplifier (e.g., the differential amplifier 430 together with the output amplifier 450). The output (e.g., the output signal 474 of the bandgap comparator) can be active low in order to provide a high level when the supply to be monitored is correctly operative. The threshold of the bandgap comparator can be selected in such a way that the cross-check comparator (e.g., the comparators 365-1, 365-2, 365,3, 365-4 of the electric device 300 of FIGS. 3A-3C) can operate correctly at this level. According to an example, a target value of the voltage sensed by the bandgap comparator (e.g., the voltage V1_bg1) is 1.5 V (but also other target values are possible) and the switching threshold is set at 20% below the target value (e.g., at 1.2 V, but also other switching/threshold levels are possible). For example, FIG. 4 shows a bandgap-based comparator for absolute supply (or other bias) voltage check.

Figure 5:
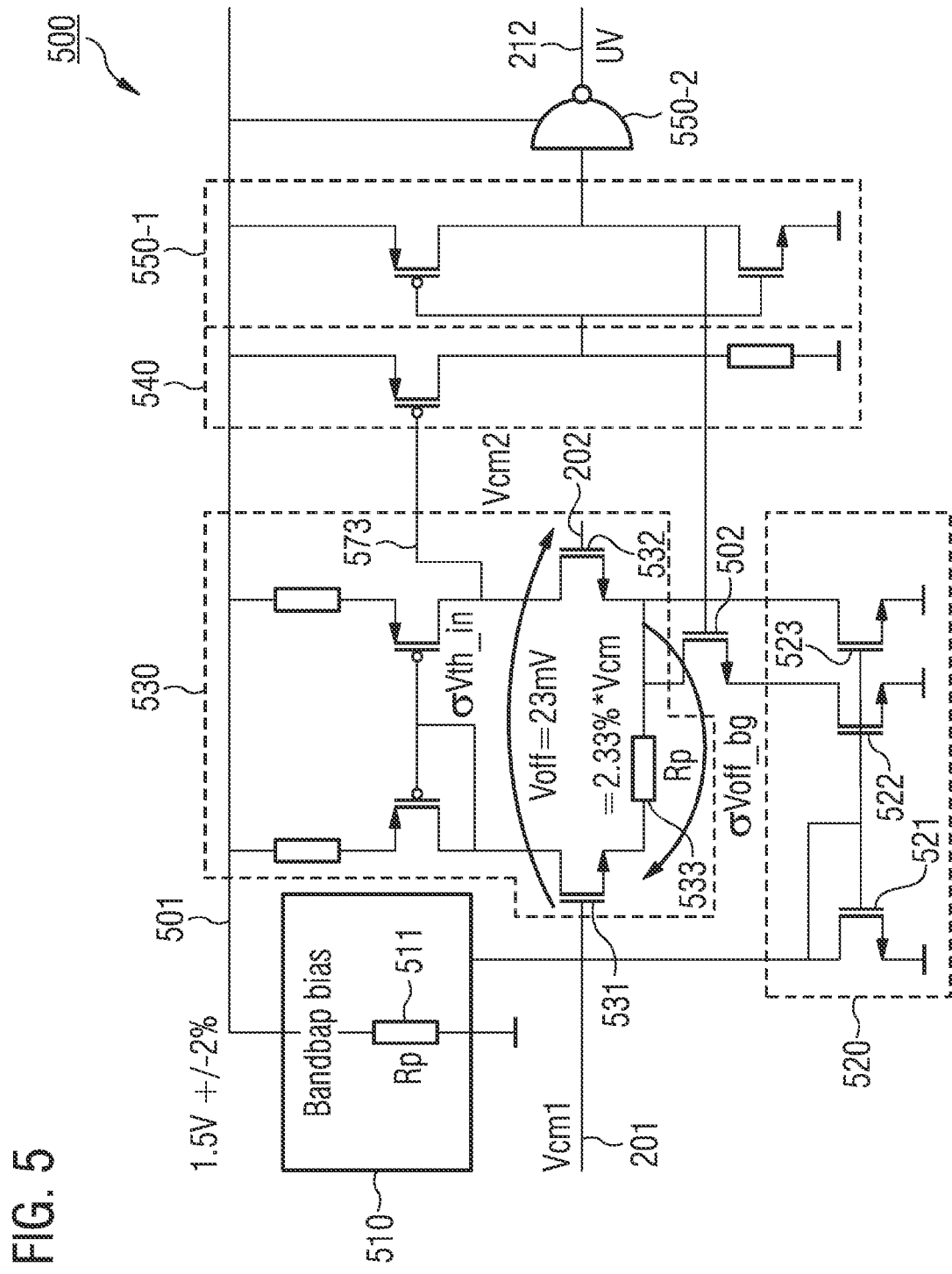
FIG. 5 shows a circuit schematic of a comparator.

FIG. 5 shows a circuit schematic of a comparator 500. The comparator 500 can, for example, be employed within the second verification circuit of the electric device 200, 300. The comparator 500 comprises a bandgap voltage reference sub-circuit 510, a current mirror sub-circuit 520, a differential input amplifier 530, an output amplifier 540, a first inverter 550-1, and a second inverter 550-2.

The base of a first transistor 531 of the differential input amplifier 530 can correspond to (e.g., be) a first sensing terminal of the comparator 500. A second transistor 532 of the differential input amplifier 530 can correspond to (e.g., be) a second sensing terminal of the comparator 500. The comparator 500 is configured to detect an undervoltage at its first sensing terminal with respect to its second sensing terminal (and/or to detect an overvoltage at its second sensing terminal with respect to its first sensing terminal).

To this end, an input resistor 533 of the differential input amplifier 530 is coupled between the source of the first transistor 531 and the source of the second transistor 532. The bandgap voltage reference sub-circuit 510 can provide (e.g., generate) a reference voltage (e.g., a bandgap based reference voltage) and supply a reference current to the reference transistor 521 of the current mirror sub-circuit 520. The amount of the reference current can be set by setting the resistance of a reference resistor 511 of the bandgap voltage reference sub-circuit 510 that can be connected between the reference voltage and the reference transistor 521 of the current mirror sub-circuit 520. This reference current can cause a mirrored current flowing through the first mirror transistor 522 and/or through the second mirror transistor 523 of the current mirror sub-circuit 520. The mirrored current can be sourced from a power supply terminal 501 of the comparator 500 and can flow through the input resistor 533, where it can cause an input offset voltage across the input resistor 533. The input offset voltage can bring the source of the first transistor 531 to be at a higher electric potential than the source of the second transistor 532 of the differential input amplifier 530.

The output voltage 573 of the differential input amplifier 530 can become smaller (e.g., closer to ground potential of the comparator 500) when a first voltage 201 applied at the base of the first transistor 531 is smaller than a second voltage 202 applied at the base of the second transistor 532 minus the input offset voltage. This situation can represent an undervoltage scenario of the first voltage 201 with respect to the second voltage 202 (or an overvoltage scenario of the second voltage 202 with respect to the first voltage 201).

The output amplifier 540 can inversely amplify the output voltage 573 of the differential input amplifier 530 causing the input voltage of the first inverter 550-1 to become larger when the first voltage 201 decreases below the second voltage 202 minus the input offset voltage. The first and the second inverter 550-1, 550-2 can then transform the input voltage of the first inverter 550-1 into a digital output signal 212 (e.g., a second output signal or a part of a second output signal of a second verification circuit that comprises the comparator 500) with clearly distinguishable digital levels. Hence, in case of an undervoltage of the first voltage 201 with respect to the second voltage 202 (and/or an overvoltage of the second voltage 202 with respect to the first voltage 201) the output signal 212 of the comparator can be at a high level (e.g., close to the supply voltage of the comparator) and otherwise at a low level (e.g., close to ground potential of the comparator).

For an accurate tuning of the input offset voltage and hence for an accurate tuning of a predefined (second) threshold of the comparator 500 for comparing the first voltage 201 with the second voltage 202, the input resistor 533 can correspond to the reference resistor 511 of the bandgap voltage reference sub-circuit 510.

Furthermore, the comparator 500 comprises an optional hysteresis loop by feeding the output voltage of the first inverter 550-1 back to the transistor 502 of the comparator 500 that is connected between the input resistor 533 of the differential input amplifier 530 and the first mirror transistor 522. For example, when the output voltage of the first inverter 550-1 is at a low level (as in the case of an undervoltage of the first voltage 201 with respect to the second voltage 202 and/or in case of an overvoltage of the second voltage 202 with respect to the first voltage 201), the transistor 502 cannot conduct and hence the mirrored current can decrease as it may only flow through the second mirror transistor 523 but not through the first mirror transistor 522. In turn, this can cause a decrease of the input offset voltage so that the first voltage 201 may have to rise to a higher level in order to become larger than the second voltage 202 minus the now reduced input offset voltage. Once, the first voltage 201 has risen again above the second voltage 202 minus the input offset voltage, meaning that the undervoltage scenario of the first voltage 201 with respect to the second voltage 202 (and/or the scenario of the overvoltage of the second voltage 202 with respect to the first voltage 201) has ended, the output voltage of the first inverter 550-1 can switch to a high level, which in turn results again in an increased input offset voltage. The optional hysteresis loop of the comparator 500 can thus stabilize the output signal 212 of the comparator 500, especially when the level of the first voltage 201 varies around the second voltage 202 minus the input offset voltage.

Figure 6:
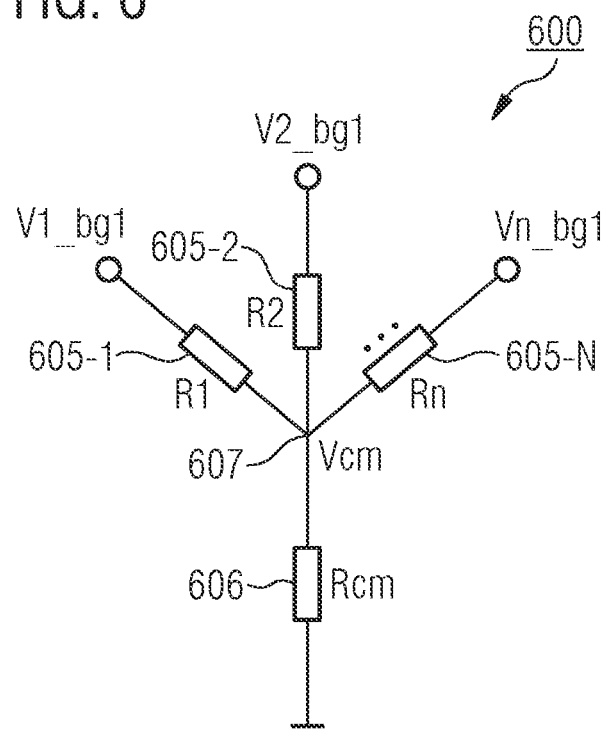
FIG. 6 shows a circuit schematic of a star connected resistive network.

FIG. 6 shows a circuit schematic of a star connected resistive network 600. The star connected resistive network 600 comprises a common resistor 606 connected between a central node 607 and ground of the star connected resistive network 600. Furthermore, the star connected resistive network 600 comprises a plurality of voltage divider resistors 605-1, 605-2, . . . , 605-N. Each voltage divider resistor is connected between an input terminal of the star connected resistive network 600 and the central node 607. In other words, FIG. 6 shows a star connection of supply domain dividers.

Turning back to FIGS. 3A-3C, the cross-check comparators 365-1, 365-2, 365,3, 365-4 can each comprise a comparator 500 as shown in FIG. 5 and can be connected to a resistive divider (e.g., a star connected resistive network 600) to provide a relative check, by comparing a branch of supply domains derived from bandgap 1 (e.g., from the first reference voltage Vref_bg1) to a branch of supply domains derived from bandgap 2 (e.g., from the second reference voltage Vref_bg2). The number of comparators can be selected in such a way: an overvoltage and undervoltage comparator to monitor a single supply deviation from its min. max. operative range. According to an implementation example, the supply domains are 2.4 V and 1.5 V domains from each bandgap core. The operative voltage range of each supply domain can be ±10% and the switching level of cross-checks can be set to ±7%, inside the operative range. 3% headroom can be provided by taking into account the process variations.

A redundancy of two additional comparators (overvoltage and undervoltage) can be optionally provided in case the supply domain used to supply the first two comparators 365-1, 365-2 is defected. Supposing the defect leads to a short to ground of the voltage V2_bg1 in FIGS. 3A-3C, the undervoltage supplied with V2_bg1 would not be able to signalize the defect with a logic high, because it is supplied with 0 V. However, the fourth undervoltage comparator 365-4, supplied with the voltage V1_bg2, would anyway trigger. In other words, the comparators 365-1, 365-3 can be employed for undervoltage detection and the comparators 365-2, 365-4 can be employed for overvoltage detection. Redundancy may be provided for two items: A comparator may be defect or a supply may be defect.

For considerations about the precision of cross-checks, the voltage divider of one branch of domains depicted in FIG. 6 (or FIGS. 3A-3C) can be analyzed by solving the circuit with Kirchhoff's law.

$$\frac{V_{1\_bg1} - V_{cn}}{R_1} + \frac{V_{2\_bg1} - V_{cn}}{R_2} + \ldots + \frac{V_{n\_bg1} - V_{cn}}{R_n} = \frac{V_{cn}}{R_{cn}} \quad \text{Equation 1.1}$$

$$\left(\frac{V_{1\_bg1}}{R_1} + \frac{V_{2\_bg1}}{R_2} + \ldots + \frac{V_{n\_bg1}}{R_n}\right)\frac{1}{G_T} = V_{cn} \quad \text{Equation 1.2}$$

where $$\frac{1}{R_{cn}} + \frac{1}{R_1} + \ldots + \frac{1}{R_n} = G_T.$$

In Equation 1.1 and Equation 1.2 $V_{1\_bg1}$, $V_{2\_bg1}$ to $V_{n\_bg1}$ denote the voltages connected to the respective input terminals of the star connected resistive network 600 relative to ground potential. These voltages are connected to the voltage divider resistors 605-1, 605-2 to 605-$n$, respectively. $R_1$, $R_2$ to $R_n$ denote the resistances of the voltage divider resistors 605-1, 605-2 to 605-N, respectively. Furthermore, $V_{cn}$ denotes the voltage of the central note 607 relative to ground potential and $R_{cn}$ denotes the resistance of the common resistor 606.

If, for example, the same switching level criterion is applied to all supply domains (e.g., to $V_{1\_bg1}$ to $V_{n\_bg1}$), the resistances $R_1$, $R_2$ to $R_n$ can be sized in accord to the supply level. That is to say, for the star connected resistive network 600 respective quotients of each of the plurality of voltages $V_{1\_bg1}$ to $V_{n\_bg1}$ to the resistance of a respective voltage divider resistor, to which the voltage is connected to, can be equal, as expressed by Equation 2.1:

$$\frac{V_{1\_bg1}}{R_1} = \frac{V_{2\_bg12}}{R_2} = \ldots = \frac{V_{n\_bg1}}{R_n} = C \text{ (constant)}$$

This can simplify Equation 1.2, resulting in Equation 2.2:

$$\frac{N \cdot C}{G_T} = V_{cn}$$

In Equation 2.2, N denotes the number of voltages connected to the input terminals of the star connected resistive network 600.

According to an embodiment $R_{cn}$ and consequently $G_T$ can be sized in order to get $V_{cn}=1$ V, (but also a different dimensioning is possible). In case of a single domain failure, for example, in $V_{1\_bg1}$ (but could be extended to any other supply domain):

$$V^*_{1\_bg1} = V_{1\_bg1} \pm \Delta_{V1\_bg1\%} \cdot V_{1\_bg1} \quad \text{Equation 3.1}$$

According to an example, $\Delta_{V1\%}$ can be set to ±7% (but also other values are possible). The percentage variation related to the defected domain can reflect to the voltage of the central node $V_{cn}$ with such relationship as given by Equation 3.2 (substitute Equation 3.1 in Equation 2.2).

$$V^*_{cn} = \frac{N \cdot C}{G_T} \pm \frac{\Delta_{V1\%} \cdot C}{G_T} \quad \text{Equation 3.2}$$

The error $error_{VCN\%}$ in percentage of $V_{cn}$ can be given by Equation 3.3:

$$\frac{\frac{\Delta_{V1\%} \cdot C}{G_T}}{\frac{N \cdot C}{G_T}} = \frac{\Delta_{V1\%}}{N} = error_{VCN\%}$$

This can mean that the number of domains to be monitored may increase the precision's requirement of cross-check comparators. According to an example, three domains (e.g., N=3) can be used and the error in %, referred to $V_{cn}$ can be 2.33% (derived from Equation 3.3).

In FIGS. 3A-3C, the functionality of each comparator (e.g., comparators 365-1, 365-2, 365-3, 365-4 of the second verification circuit) can be sensing the star center (e.g., the central node) of the two branches of dividers (e.g., of the star connected resistive networks 361-1, 361-2) and providing an offset (e.g., an input offset voltage), which consists of a voltage equivalent to the switching level, (e.g., $(\Delta\_(V1\%) \cdot C)/G\_T$). When one domain deviates from its target value more than the mentioned offset, at least one of the comparators can trigger.

The sign of offset (e.g., an input offset voltage) can define whether the domain triggers in overvoltage mode or undervoltage mode for one branch of domains and vice-versa for the other branch.

Referring to an example, for instance, $V_{1\_bg1}=1.5$ V and $\Delta_{V1\%}=7\%$. The switching level of the overvoltage can then be $1.5$ V+7%*1.5 V=1.605 V, which referring to a common node voltage (e.g., of the central node 607), can be 1 V+2.33%*1 V=1.0233V. Consequently, an offset (e.g., an input offset voltage) of 23 mV can be designed for the comparator. The common node voltage can be a mean of different voltages derived from voltage dividers.

The total inaccuracy a $\sigma_{vcn,TOT}$ of the cross-check can be expressed by:

$$\sigma_{vcn,TOT} = \sqrt{\sigma_{divider}^2 + \sigma_{vth,input}^2 + \sigma_{voff\_bg}^2}$$

The main mismatch contributors can be the voltage dividers (e.g., the star connected resistive networks 361-1, 361-2 expressed by the variance $\sigma_{divider}^2$ the input pair in comparators expressed by the variance $\sigma_{vth,input}^2$, and the bandgap inaccuracy reflected in the input offset voltage defining the switching threshold as expressed by the variance $\sigma_{voff\_bg}^2$.

The inaccuracy $\sigma_\%$ (it is the ratio, calculated at the inputs of the comparator, between the error due to the total mismatch and the offset designed for the switching of the monitored supply) of the switching level is given by Equation 4.1:

$$\sigma_\% = \frac{\sigma_{vcn,TOT}}{\frac{\Delta_{V1\%} \cdot C}{G_T}}$$

According to an example, $\sigma_{vcn,TOT}=1.55$ mV and the offset, as already mentioned, $$\frac{\Delta_{V1\%} \cdot C}{G_T} = 23\,\text{mV}.$$

This can mean that the inaccuracy of the switching level is 6.7% one sigma, resulting from Equation 4.1. Consequently, the switching level variation due to mismatch contributors can be, for example:

$$\Delta_{V1\%, variation} = \Delta_{V1\%} \pm (3\sigma_\% * \Delta_{V1\%}) = \pm 7\% \pm 1.4\%$$

This can mean that the inaccuracy of a cross-check comparator (e.g., comparator 365-1, 365-2, 365-3, and/or 365-4) in relation to the switching level of a supply domain is low (because it's percentage of percentage).

Figure 7:
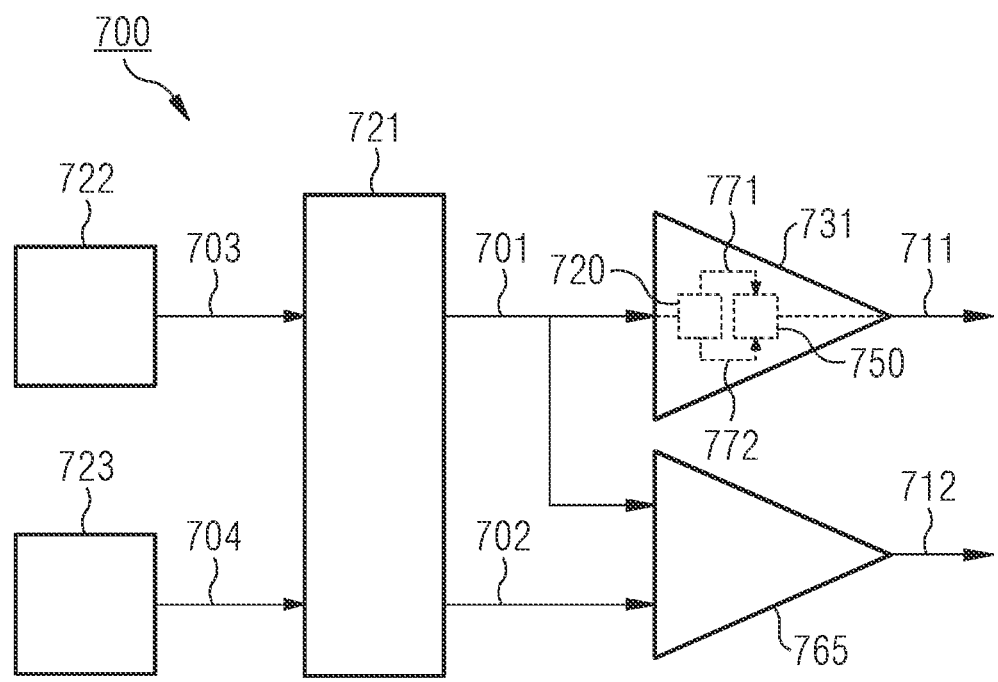
FIG. 7 shows a block diagram of an integrated circuit.

FIG. 7 shows a block diagram of an integrated circuit 700. The integrated circuit 700 comprises a first bandgap voltage reference sub-circuit 722 configured to provide a first bandgap reference voltage 703. Furthermore, the integrated circuit 700 comprises a second bandgap voltage reference sub-circuit 723 configured to provide a second bandgap reference voltage 704. Furthermore, the integrated circuit 700 comprises a voltage regulator sub-circuit 721 configured to derive a first supply voltage 701 using the first bandgap reference voltage 703 and a second supply voltage 702 using the second bandgap reference voltage 704. Furthermore, the integrated circuit 700 comprises a bandgap comparator sub-circuit 731 configured to derive a first internal voltage 771 and a second internal voltage 772 from the first supply voltage 701. The first internal voltage 771 decreases at a higher rate than the second internal voltage 772 with respect to a decreasing first supply voltage 701. The bandgap comparator sub-circuit 731 is configured to compare the first internal voltage 771 with the second internal voltage 772 and to indicate which of the first internal voltage 771 and the second internal voltage 772 is larger than the other by a first output signal 711. Furthermore, the integrated circuit 700 comprises a comparator sub-circuit 765 configured to compare the first supply voltage 701 with the second supply voltage 702 and to indicate a deviation between the first and the second supply voltage larger than a predefined threshold by a second output signal 712.

The integrated circuit 700 allows monitoring the supply voltages 701, 702 derived from (independent) bandgap reference voltages 703, 704 that can be generated within the integrated circuit 700. This can enhance the operational reliability of integrated circuit. The bandgap comparator sub-circuit 731 can perform an absolute check of the first supply voltage 701, meaning comparing the level of the first supply voltage 701 to ground potential. This can be achieved by deriving the first and the second internal voltage 771, 772 from the first supply voltage 701 in a way such that the first internal voltage 771 decreases at a higher rate than the second internal voltage 772 with respect to a decreasing first supply voltage 701. By comparing the first and the second internal voltage 771, 772, the absolute level of the first supply voltage 701 can then be determined and/or compared against a predefined (first) threshold.

The comparator sub-circuit 765 can compare the first supply voltage 701 with the second voltage 702 and can thus perform a relative check (or cross check) between the first and the second supply voltage 701, 702. This can relax the manufacturing tolerances and thus reduce manufacturing costs and/or size of the integrated circuit 200. Performing an absolute check of a voltage (e.g., referenced to ground potential) may in itself require smaller manufacturing tolerances for the bandgap comparator sub-circuit 731 for reaching an acceptable inaccuracy of the absolute check. On the other hand, the relative check between the first and the second supply voltage 701, 702 may in itself allow larger manufacturing tolerances of the comparator sub-circuit 765 for reaching an acceptable inaccuracy of the relative check, or a relative check may be easier to implement than an absolute check so that lower manufacturing tolerances of the comparator sub-circuit 765 can be reached with less effort.

Thus, the absolute check of the bandgap comparator sub-circuit 731 may be performed at a higher inaccuracy than the relative check of the comparator sub-circuit 765. With an uncertainty corresponding to the inaccuracy of the bandgap comparator sub-circuit 731, the absolute check of the bandgap comparator sub-circuit 731 can then indicate via the first output signal 711 whether the absolute level of the first supply voltage 701 is within a predefined first tolerance range. In order to avoid a false alarm because of the higher inaccuracy of the absolute check of the first voltage 701, a first tolerance range of the bandgap comparator sub-circuit 731 can be made wider.

With a lower uncertainty corresponding to the lower inaccuracy of the comparator sub-circuit 765, the relative check of the comparator sub-circuit 765 can indicate via the second output signal 712 whether a deviation between the first supply voltage 701 and the second supply voltage 702 is smaller than a predefined second tolerance range (or a predefined second threshold). Assuming that in most cases there are only single errors present within the integrated circuit 700 (e.g., either the first or the second supply voltage may be deviate too much from its respective target value), a pass of both the absolute check and the relative check can be indicative for both the first and the second supply voltage 701, 702 (referenced to ground potential) being within their respective tolerance range. This result can be given at the lower inaccuracy of the comparator sub-circuit 765.

The bandgap comparator sub-circuit 731 can, for example, comprise a bandgap kernel 720 for deriving the first and the second internal voltage 771, 772. The bandgap comparator sub-circuit 731 can further comprise an internal comparator 750 for comparing the first internal voltage with the second internal voltage and for providing the first output signal 711. The first and the second bandgap voltage reference sub-circuit 722, 723 can each comprise an own bandgap kernel for providing the first and the second bandgap reference voltage 703, 704, respectively.

Figure 8:
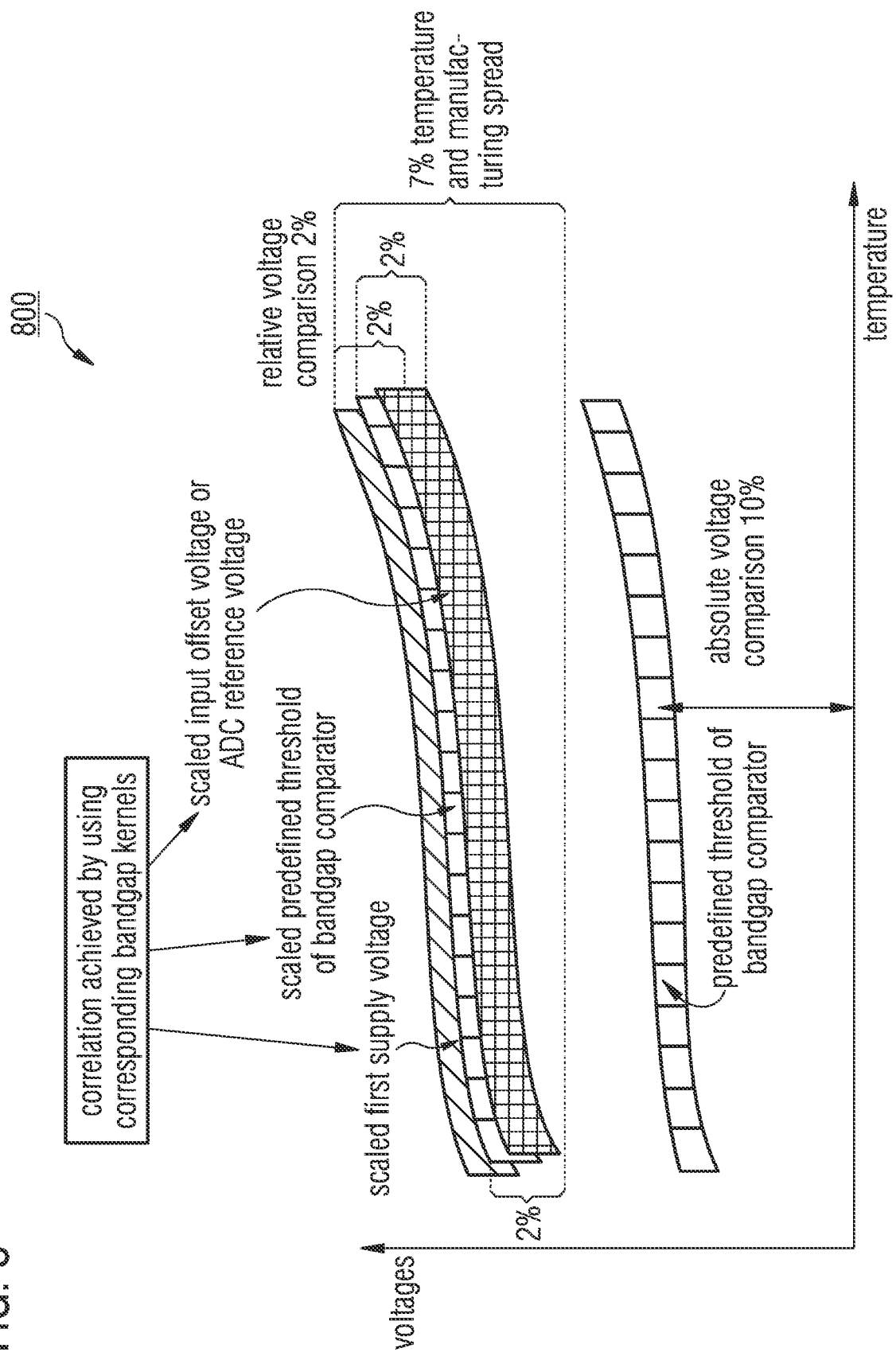
FIG. 8 shows a graph of variation of correlated voltages over temperature.

According to some examples, the bandgap comparator sub-circuit 731 as well as the first and the second bandgap voltage reference sub-circuit 722, 723 comprise respective bandgap kernels corresponding to each other. This can result in a correlation of the first and the second supply voltage 701, 702 as well as in a correlation between the first supply voltage 701 and a predefined threshold of the bandgap comparator sub-circuit 731 versus temperature and/or manufacturing variations of the integrated circuit 700. In turn, this can enhance the accuracy of the monitoring of the first and the second supply voltage 701, 702 as depicted in FIG. 8, which shows relaxed comparator requirements with usage of correlated voltages 800. For example, 2% instead of 7% over temperature and technology spread can be reached. In other words, due to temperature (and/or manufacturing) variations both the first and the second supply voltage 701, 702 can each vary by maximally 7% of their respective target value. However, due to their correlation the first and the second supply voltage 701, 702 may only vary by 2% with respect to each other. Hence, the inaccuracy for comparing the first supply voltage 701 with the second supply voltage 702 at the comparator sub-circuit 765 can be decreased. Further inaccuracy reduction can be reached by correlating the first and/or the second supply voltage 701, 702 with an input offset voltage of a comparator (or comparators) and/or with an ADC reference voltage of an ADC (or ADCs) of the comparator sub-circuit 765. This is illustrated in FIG. 8 by a scaled first supply voltage varying equally (or similarly) as a scaled input offset voltage (or a scaled ADC reference voltage) over temperature. To this end, the comparator sub-circuit 765 can comprise a comparator with an input offset voltage and/or an ADC with a reference voltage generated by a bandgap kernel corresponding to the bandgap kernel of the first and/or the second bandgap voltage reference sub-circuit 722, 723. Moreover, the first supply voltage 701 can be correlated with the predefined (first) threshold of the bandgap comparator sub-circuit 731 versus temperature (and/or manufacturing) variations. This can decrease the inaccuracy for comparing the first supply voltage 701 with the predefined (first) threshold of the bandgap comparator sub-circuit 731 and is illustrated in FIG. 8 by the scaled first supply voltage varying equally (or similarly) as the scaled predefined threshold of the bandgap comparator.

The comparator sub-circuit 765 can be configured to detect an overvoltage of the first supply voltage 701 with respect to the second supply voltage 702 (or vice versa). The integrated circuit 700 can comprise an additional comparator sub-circuit to detect an undervoltage of the first supply voltage 701 with respect to the second supply voltage 702 (or vice versa, respectively). The integrated circuit 700 can comprise further additional comparator sub-circuits 765 for redundancy.

A power supply terminal of the comparator sub-circuit 765 can optionally be connected to the first supply voltage 701. This can improve the operational reliability of the integrated circuit 700, because a failure of the supply voltage 701 (e.g., a too low supply voltage) of the comparator sub-circuit 765, which can cause an unreliable operation of the comparator sub-circuit 765, can be detected by the bandgap comparator sub-circuit 731.

The first and/or the second output signal 711, 712 can each be a warning signal, a reset signal, a diagnosis signal, and/or an interrupt signal that can be provided to other circuitry of the integrated circuit 700 and/or to a user of the integrated circuit 700. Furthermore, the first and the second output signal 711, 712 can be combined to derive a third output signal as explained in context of the electric device 200 of FIG. 2.

FIG. 9 shows a flow chart of a method 900 for monitoring voltages. The method 900 comprises providing 910 a first and a second voltage. Furthermore, the method 900 comprises deriving 920 a first internal voltage and a second internal voltage from the first voltage. The first internal voltage decreases at a higher rate than the second internal voltage with respect to a decreasing first voltage. Furthermore, the method 900 comprises comparing 930 the first internal voltage with the second internal voltage. Furthermore, the method 900 comprises generating 940 a first output signal based on the comparison of the first internal voltage with the second internal voltage. Furthermore, the method 900 comprises comparing 950 the first voltage with the second voltage. Furthermore, the method 900 comprises generating 960 a second output signal based on the comparison of the first voltage with the second voltage. Furthermore, the method 900 comprises generating 970 a third output signal if at least one of the first and the second output signal is indicative for at least one of the first and the second voltage being outside a predefined tolerance range.

According to the method 900 an absolute check of the first voltage (e.g., relative to ground potential) and a relative check between the first and the second voltage (e.g., with respect to each other) can be performed. This can increase the accuracy of the monitoring of the voltages, which in turn can provide a higher operational stability and/or a higher availability of an electric device whose voltages are monitored according to the method 900.

Additionally, the method 900 can comprise providing a first bandgap kernel, a second bandgap kernel, and a third bandgap kernel. The first bandgap kernel, the second bandgap kernel, and the third bandgap kernel can correspond to each other. Furthermore, the method 900 can comprise generating a first reference voltage using the first bandgap kernel. Furthermore, method 900 can comprise generating a second reference voltage using the second bandgap kernel. Furthermore, the method 900 can comprise deriving the first voltage from the first reference voltage and the second voltage from the second reference voltage. Furthermore, the method 900 can comprise using the first bandgap kernel to derive the first and the second internal voltage.

This can result in a correlation between the first and the second voltage versus temperature and/or manufacturing variations, which can decrease the inaccuracy when comparing the first with the second voltage. Moreover, this can also result in a correlation between the first voltage and a predefined threshold against which the first voltage is compared to. For example, the first voltage can be at the predefined threshold when the first and the second internal voltage are equal. Due to the correlation, an absolute check of the first voltage (that can be performed by comparing the first and the second internal voltage) can be less susceptible towards temperature and/or manufacturing variations of the electric device whose voltages are monitored according to the method 900. This can increase the operational reliability and/or the operational availability of the electric device.

The third output signal generated when performing the method 900 can be a warning signal, a reset signal, a diagnosis signal, and/or an interrupt signal that can be provided to other circuitry of the electric and/or to a user of the electric device.

Some examples of the present disclosure relate to supply diagnosis for sensors with functional safety. This can comprise an absolute check referenced to a bandgap circuits (e.g., 2% accuracy) and can comprise significantly more accurate cross checks (e.g., 0.2%) between different supply domains (e.g., 0.2% can be achievable with much lower effort such as manufacturing effort). The cross checks can operate inside the specified operating range of each supply generator and can make a relative comparison instead of absolute comparison to ground. Correlation (process spread and temperature) can be used between bandgap-based references, supply generators, and resets or overvoltage comparators to allow accurate cross checks.

Other examples relate to a dedicated analog-to-digital converter, which can be multiplexed to check different domains. This can provide a flexible use. However, EMC robustness may be reduced, folding down effects may occur, its area might not be smaller, and it may be more complicated in architecture.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An integrated circuit, comprising:
a first bandgap voltage reference sub-circuit configured to provide a first bandgap reference voltage;
a second bandgap voltage reference sub-circuit configured to provide a second bandgap reference voltage;
a voltage regulator sub-circuit configured to derive a first supply voltage using the first bandgap reference voltage and a second supply voltage using the second bandgap reference voltage;
a bandgap comparator sub-circuit configured to derive a first internal voltage and a second internal voltage from the first supply voltage, wherein the first internal voltage decreases at a higher rate than the second internal voltage with respect to a decreasing first supply voltage, wherein the bandgap comparator sub-circuit is configured to compare the first internal voltage with the second internal voltage and to indicate which of the first internal voltage and the second internal voltage is larger by a first output signal; and
a comparator sub-circuit configured to compare the first supply voltage with the second supply voltage and to indicate by a second output signal whether a difference between the first supply voltage and the second supply voltage is larger than a predefined threshold.

2. The integrated circuit of claim 1, wherein the first output signal has a first value, indicating that the first supply voltage is within a first predefined tolerance range, when the first internal voltage is greater than the second internal voltage, and the first output signal has a second value, indicating that the first supply voltage is outside the first predefined tolerance range, when the first internal voltage is less than the second internal voltage.

3. The integrated circuit of claim 1, wherein the first internal voltage is substantially linearly dependent on the first supply voltage and the second internal voltage is substantially logarithmically dependent on the first supply voltage.

4. The integrated circuit of claim 1, wherein:
the second output signal has a first value when a difference between the first supply voltage and the second supply voltage is less than the predefined threshold, and
the second output signal has a second value when the difference between the first supply voltage and the second supply voltage is greater than the predefined threshold, indicating that at least one of the first supply voltage or the second supply voltage deviates too far from its respective target value.

5. The integrated circuit of claim 1, wherein:
the first output signal has a first value, indicating that the first supply voltage is within a first predefined tolerance range, when the first internal voltage is greater than the second internal voltage,
the first output signal has a second value, indicating that the first supply voltage is outside the first predefined tolerance range, when the first internal voltage is less than the second internal voltage,
the second output signal has a third value when a difference between the first supply voltage and the second supply voltage is less than the predefined threshold, and
the second output signal has a fourth value when the difference between the first supply voltage and the second supply voltage is greater than the predefined threshold, indicating that at least one of the first supply voltage or the second supply voltage deviates too far from its respective target value.

6. The integrated circuit of claim 1, wherein the bandgap comparator sub-circuit comprises a bandgap comparator configured to derive the first internal voltage and the second internal voltage from the first supply voltage and to compare the first internal voltage with the second internal voltage, wherein both a sensing terminal and a power supply terminal of the bandgap comparator are connected to the first supply voltage.

7. The integrated circuit of claim 1, wherein the comparator sub-circuit comprises a first comparator, wherein a first sensing terminal of the first comparator is connected to a first input terminal of the comparator sub-circuit and a second sensing terminal of the first comparator is connected to a second input terminal of the comparator sub-circuit, wherein an input offset voltage of the first comparator corresponds to the predefined threshold for comparing the first supply voltage with the second supply voltage.

8. An electrical device, comprising:
a first bandgap voltage reference sub-circuit configured to provide a first bandgap reference voltage;
a second bandgap voltage reference sub-circuit configured to provide a second bandgap reference voltage;
a voltage regulator sub-circuit configured to derive a first supply voltage using the first bandgap reference voltage and a second supply voltage using the second bandgap reference voltage;
a first verification circuit comprising a first input terminal for the first supply voltage and configured to derive a first internal voltage and a second internal voltage from the first supply voltage, to compare the first internal voltage with the second internal voltage, and to generate a first output signal based on a comparison of the first internal voltage with the second internal voltage,
wherein the first output signal has a first value, indicating that the first supply voltage is within a first predefined tolerance range, when the first internal voltage is greater than the second internal voltage, and
wherein the first output signal has a second value, indicating that the first supply voltage is outside the first predefined tolerance range, when the first internal voltage is less than the second internal voltage;
a second verification circuit comprising a second input terminal for the first supply voltage and a third input terminal for the second supply voltage and configured to compare the first supply voltage with the second supply voltage and to generate a second output signal based on a comparison of the first supply voltage with the second supply voltage; and
a combination circuit configured to generate a third output signal if at least one of the first output signal or the second output signal is indicative of at least one of the first supply voltage or the second supply voltage being outside a respective predefined tolerance range.

9. The electrical device of claim 8, wherein the first internal voltage is substantially linearly dependent on the first supply voltage and the second internal voltage is substantially logarithmically dependent on the first supply voltage.

10. The electrical device of claim 9, wherein:
the second output signal has a third value when a difference between the first supply voltage and the second supply voltage is less than a predefined threshold, and
the second output signal has a fourth value when the difference between the first supply voltage and the second supply voltage is greater than the predefined threshold, indicating that at least one of the first supply voltage or the second supply voltage deviates too far from its respective target value.

11. The electrical device of claim 8, wherein:
the second output signal has a third value when a difference between the first supply voltage and the second supply voltage is less than a predefined threshold, and
the second output signal has a fourth value when the difference between the first supply voltage and the second supply voltage is greater than the predefined threshold, indicating that at least one of the first supply voltage or the second supply voltage deviates too far from its respective target value.

12. The electrical device of claim 8, wherein the first verification circuit comprises a bandgap comparator configured to derive the first internal voltage and the second internal voltage from the first supply voltage and to compare the first internal voltage with the second internal voltage, wherein both a sensing terminal and a power supply terminal of the bandgap comparator are connected to the first supply voltage.

13. The electrical device of claim 8, wherein the second verification circuit comprises a first comparator, wherein a first sensing terminal of the first comparator is connected to the second input terminal of the second verification circuit and a second sensing terminal of the first comparator is connected to the third input terminal of the second verification circuit, wherein an input offset voltage of the first comparator corresponds to a predefined threshold for comparing the first supply voltage with the second supply voltage.

14. An electrical device, comprising:
a first verification circuit comprising a first input terminal for a first supply voltage and configured to derive a first internal voltage and a second internal voltage from the first supply voltage, to compare the first internal voltage with the second internal voltage, and to generate a first output signal based on a comparison of the first internal voltage with the second internal voltage,
wherein the first output signal has a first value, indicating that the first supply voltage is within a first predefined tolerance range, when the first internal voltage is greater than the second internal voltage, and
wherein the first output signal has a second value, indicating that the first supply voltage is outside the first predefined tolerance range, when the first internal voltage is less than the second internal voltage;

a second verification circuit comprising a second input terminal for the first supply voltage and a third input terminal for a second supply voltage and configured to compare the first supply voltage with the second supply voltage and to generate a second output signal based on a comparison of the first supply voltage with the second supply voltage; and a combination circuit configured to generate a third output signal if at least one of the first output signal or the second output signal is indicative of at least one of the first supply voltage or the second supply voltage being outside a respective predefined tolerance range.

15. The electrical device of claim 14, wherein the first internal voltage is substantially linearly dependent on the first supply voltage and the second internal voltage is substantially logarithmically dependent on the first supply voltage.

16. The electrical device of claim 15, wherein:
the second output signal has a third value when a difference between the first supply voltage and the second supply voltage is less than a predefined threshold, and
the second output signal has a fourth value when the difference between the first supply voltage and the second supply voltage is greater than the predefined threshold, indicating that at least one of the first supply voltage or the second supply voltage deviates too far from its respective target value.

17. The electrical device of claim 14, wherein:
the second output signal has a third value when a difference between the first supply voltage and the second supply voltage is less than a predefined threshold, and
the second output signal has a fourth value when the difference between the first supply voltage and the second supply voltage is greater than the predefined threshold, indicating that at least one of the first supply voltage or the second supply voltage deviates too far from its respective target value.

18. The electrical device of claim 14, wherein the first verification circuit comprises a bandgap comparator configured to derive the first internal voltage and the second internal voltage from the first supply voltage and to compare the first internal voltage with the second internal voltage, wherein both a sensing terminal and a power supply terminal of the bandgap comparator are connected to the first supply voltage.

19. The electrical device of claim 14, wherein the second verification circuit comprises a first comparator, wherein a first sensing terminal of the first comparator is connected to the second input terminal of the second verification circuit and a second sensing terminal of the first comparator is connected to the third input terminal of the second verification circuit, wherein an input offset voltage of the first comparator corresponds to a predefined threshold for comparing the first supply voltage with the second supply voltage.

* * * * *